United States Patent [19]
Sakaguchi et al.

[11] Patent Number: 6,100,166
[45] Date of Patent: Aug. 8, 2000

[54] PROCESS FOR PRODUCING SEMICONDUCTOR ARTICLE

[75] Inventors: Kiyofumi Sakaguchi, Yokohama; Takao Yonehara, Atsugi; Shoji Nishida, Hiratsuka; Kenji Yamagata, Sagamihara, all of Japan

[73] Assignee: Canon Kabushiki Kaisha, Tokyo, Japan

[21] Appl. No.: 08/993,034

[22] Filed: Dec. 18, 1997

[30] Foreign Application Priority Data

Dec. 18, 1996 [JP] Japan ..................................... 8-354342

[51] Int. Cl.$^7$ .............................. H01L 21/30; H01L 21/46
[52] U.S. Cl. .......................... 438/455; 438/457; 438/459
[58] Field of Search ................................... 438/455, 457, 438/459

[56] References Cited

U.S. PATENT DOCUMENTS

| | | | |
|---|---|---|---|
| 4,445,965 | 5/1984 | Milnes | 156/624 |
| 4,582,559 | 4/1986 | Tanielian et al. | 156/603 |
| 4,816,420 | 3/1989 | Bozler et al. | 437/2 |
| 5,273,938 | 12/1993 | Lin et al. | 438/127 |
| 5,391,257 | 2/1995 | Sullivan et al. | 438/458 |
| 5,397,713 | 3/1995 | Hamamoto et al. | 437/4 |
| 5,618,739 | 4/1997 | Takahashi et al. | 438/458 |
| 5,670,411 | 9/1997 | Yonehara et al. | 438/459 |
| 5,695,557 | 12/1997 | Yamagata et al. | 117/97 |

FOREIGN PATENT DOCUMENTS

| | | |
|---|---|---|
| 0757377 | 2/1997 | European Pat. Off. . |
| 0793263 | 9/1997 | European Pat. Off. . |
| 1289831 | 12/1961 | Germany . |
| 5021338A | 1/1993 | Japan . |
| 5211128 | 8/1993 | Japan . |
| 6045622A | 2/1994 | Japan . |
| 7302889 | 11/1995 | Japan . |
| 08213645 | 8/1996 | Japan . |
| 8213645A | 8/1996 | Japan . |

OTHER PUBLICATIONS

Imai, K. et al., "Crystalline Quality of Silicon Layer Formed by Fipos Technology," *Journal of Crystal Growth*, vol. 63, p. 547 (1983).

Cullen, M.T., et al., "Heteroepitaxial Silicon Characterization: Microstructure as Related to UV Reflectometry," *Journal of Crystal Growth*, vol. 63, p. 205 (1983).

Van Veen, A., et al., "Helium–Induced Porous Layer Formation in Silicon," *Materials Research Society Symposium Proceedings*, vol. 107, p. 449 (1987).

Raineri, V., "Silicon–On–Insulator Produced by Helium Implantation and Thermal Oxidation," *Applied Physics Letters*, vol. 66, p. 3654 (1995).

Baumgart, H., et al., "Light Scattering Topography Characterization of Bonded SOI Wafers," Proceedings of the First International Symposium on Semiconductor Wafer Bonding: Science, Technology, and Applications, Proceedings vol. 92–7, p. 375 (1991).

Hunt, Charles E., et al., "Thinning of Bonded Wafers: Etch–Stop Approaches," Proceedings of the First International Symposium on Semiconductor Wafer Bonding: Science, Technology, and Applications, Proceedings vol. 92–7, p. 165.

Yonehara, Takao, et al., "Epitaxial Layer Transfer by Bond and Etch Back of Porous SI," *Applied Physics Letters*, vol. 64, p. 2108 (1994).

Maszara, W.P., "Silicon–On–Insulator by Wafers Bonding: A Review," *Journal of the Electrochemical Society*, No. 1, p. 341 (1991).

Harendt, Christine, et al., "Silicon On Insulator Material by Wafer Bonding," *Journal of Electronic Materials*, vol. 20, p. 267 (1991).

Milnes, A.G., "Peeled Film Technology for Solar Cells," The Conference Record of the Eleventh IEEE Photovoltaic Specialists Conference—1975, May 6–8, 1975, p. 338.

*Primary Examiner*—Kevin M. Picardat
*Assistant Examiner*—D. M. Collins
*Attorney, Agent, or Firm*—Fitzpatrick, Cella, Harper & Scinto

[57] ABSTRACT

A process for producing a semiconductor article is provided which comprises the steps of bonding a film onto a substrate having a porous semiconductor layer, and separating the film from the substrate at the porous semiconductor layer by applying a force to the film in a peeling direction.

78 Claims, 15 Drawing Sheets

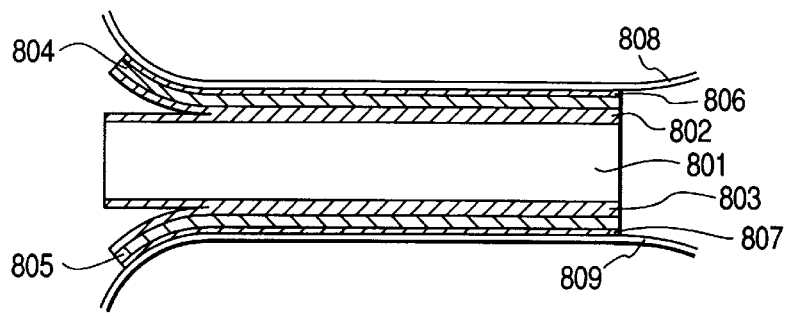
FIG. 9A
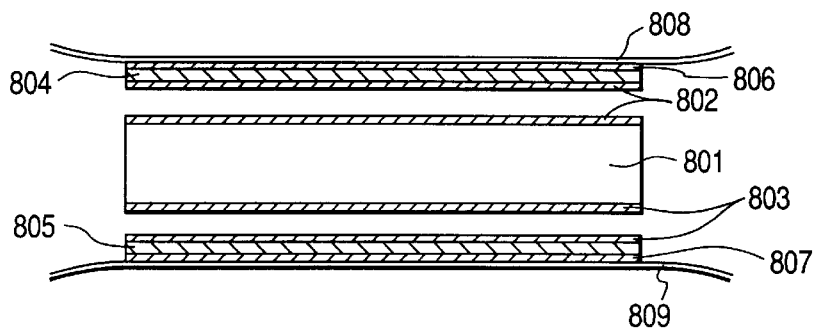
FIG. 9B
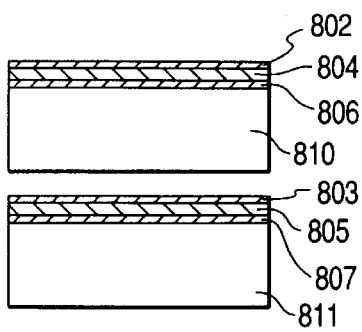
FIG. 9CA
FIG. 9CC
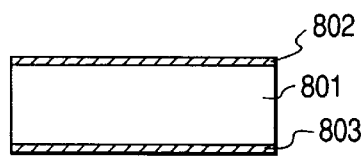
FIG. 9CB
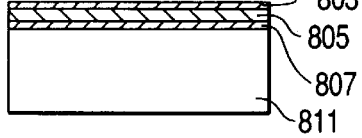
FIG. 9DA
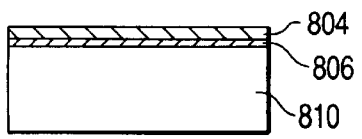
FIG. 9DC
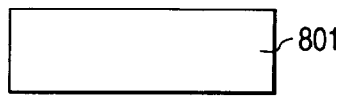
FIG. 9DB

PROCESS FOR PRODUCING SEMICONDUCTOR ARTICLE

BACKGROUND OF THE INVENTION

1. Field of the Invention

This invention relates-to a process for producing a semiconductor article that can suitably be used for producing a semiconductor device such as a semiconductor integrated circuit, a solar cell, a semiconductor laser device or a light emitting diode. More particularly, it relates to a process for producing a semiconductor article including a step of separating a substrate.

2. Related Background Art

Semiconductor articles are popular in terms of semiconductor wafers, semiconductor substrates and various semiconductor devices and include those adapted for producing semiconductor devices by utilizing the semiconductor region thereof and those used as preforms for producing semiconductor devices.

Some semiconductor articles of the type under consideration comprise a semiconductor layer arranged on an insulator.

The technology of forming a single crystal silicon semiconductor layer on an insulator is referred to as silicon on insulator (SOI) technology, which is widely known. Various research has been done to exploit the remarkable advantages of SOI that cannot be achieved by using bulk Si substrates that are used for producing ordinary Si integrated circuits. The advantages of the SOI technology include:

1. The ease of dielectric isolation that allows an enhanced degree of integration;
2. The excellent resistivity against radiation;
3. A reduced floating capacitance that allows a high device operation speed;
4. The omission of the well forming step;
5. The effect of latch up prevention; and
6. The possibility of producing fully depleted field effect transistors using the thin film technology. The advantages of the SOI technology are thoroughly discussed in Special Issue: "Single-crystal silicon on non-single-crystal insulators"; edited by G. W. Cullen, Journal of Crystal Growth, volume 63, No. 3, pp. 429–590 (1983).

In recent years, a number of reports have been published on the SOI technology for providing substrates that can realize high speed operation and low power consumption for MOSFETs (IEEE SOI conference 1994). The process of manufacturing a semiconductor device can be significantly enhanced by using the SOI structure when compared with the corresponding process of manufacturing a device on a bulk Si wafer, because of the implementation of a very simplified device isolation step. Thus, the use of the SOI technology can provide a significant cost reduction in manufacturing a semiconductor device, particularly in terms of the wafer cost and the process cost if viewed from the conventional technology of manufacturing a MOSFET or an IC on a bulk Si substrate, to say nothing of the remarkable performance of such a semiconductor device.

Fully depleted MOSFETs are very promising for achieving high speed operation and low power consumption if provided with improved drive power. Generally speaking, the threshold voltage (Vth) of a MOSFET is determined as a function of the impurity concentration of its channel section but, in the case of a fully depleted (FD) MOSFET, the characteristics of the depletion layer are influenced by the SOI film thickness. Therefore, the SOI film thickness has to be rigorously controlled in order to improve the yield of manufacturing LSIs.

Meanwhile, a device formed on a compound semiconductor shows a remarkable level of performance that cannot be expected from silicon, particularly in terms of high speed operation and light emission. Such devices are currently formed by means of epitaxial growth on a compound semiconductor substrate that may be made of GaAs or a similar compound. However, a compound semiconductor substrate is costly and mechanically not very strong so that it is not adapted to produce a large wafer.

Thus, efforts have been made to form a compound substrate by hetero-epitaxial growth on a Si wafer that is inexpensive, mechanically strong and good for producing a large wafer.

Research on forming SOI substrates became significant in the 1970s. Initially, attention was paid to the technique of producing single crystal silicon by epitaxial growth on a sapphire substrate (SOS: silicon on sapphire), that of producing a SOI structure through full isolation by porous oxidized silicon (FIPOS) and the oxygen ion implantation technique. The FIPOS method comprises steps of forming an island of N-type Si layer on a P-type single crystal Si substrate by proton/ion implantation (Imai et al., J. Crystal Growth, Vol. 63,547 (1983)) or by epitaxial growth and patterning, transforming only the P-type Si substrate into a porous substrate by anodization in a HF solution, shielding the Si islands from the surface, and then subjecting the N-type Si islands to dielectric isolation by accelerated oxidation. This technique is, however, accompanied by a problem that the isolated Si region is defined before the devices are produced and restricts the freedom of device design.

The oxygen ion implantation method is also referred as the SIMOX method, which was proposed by K. Izumi for the first time. With this technique, oxygen ions are implanted into a Si wafer to a concentration level of $10^{17}$ to $10^{18}/cm^2$ and then the latter is annealed at high temperature of about 1,320° C. in an argon/oxygen atmosphere. As a result, the implanted oxygen ions are chemically combined with Si atoms to produce a silicon oxide layer that is centered at a depth corresponding to the projection range (Rp) of the implanted ions. Under this condition, an upper portion of the Si oxide layer that is turned into an amorphous state by the oxygen ion implantation is recrystallized to produce a single crystal Si layer. While the surface Si layer used to show a defect rate as high as $10^5/cm^2$, a recent technological development has made it possible to reduce the defect rate down to about $10^2/cm^2$ by selecting a rate of oxygen implantation of about $4\times10^{17}/cm^2$. However, the allowable range of energy infusion and that of ion implantation are limited if the film quality of the Si oxide layer and the crystallinity of the surface Si layer are to be held to respective desired levels. Hence the film thickness of the surface Si layer and that of the buried Si oxide (BOX; buried oxide) layer are allowed to take only limited values. In other words, a process of sacrificial oxidation or epitaxial growth is indispensable to realize a surface Si layer having a desired film thickness. Such a process by turn gives rise to a problem of uneven film thickness due to the intrinsic adverse effect of the process.

There have been reports saying that SIMOX can produce defective Si oxide regions in the Si oxide layer that are referred to as pipes. One of the possible causes of the phenomenon may be foreign objects such as dust introduced into the layer at the time of ion implantation. The device produced in a pipe region can show degraded characteristics due to the leak current between the active layer and the underlying substrate.

The SIMOX technique involves the use of a large volume of ions that is by far greater than the volume used in the ordinary semiconductor process and hence the ion implantation process may take a long time if a specifically designed apparatus is used for it. Since the ion implantation process is performed typically by raster scanning of an ion beam showing a predetermined flow rate of electric current or by spreading an ion beam, a long time may be required for processing a large wafer. Additionally, when a large wafer is processed at high temperature, the slip problem due to an uneven temperature distribution within the wafer can become very serious. Since the SIMOX process requires the use of extraordinary high temperature that is as high as 1,320° C., which is not observed in the ordinary Si semiconductor process, the problem of uneven temperature distribution will become more serious if a large wafer has to be prepared, unless a highly effective apparatus is not realized.

Beside the above described known techniques of forming SOI, a technique of bonding a single crystal Si substrate to another single crystal Si substrate that has been thermally oxized to produce an SOI structure has been proposed recently. This method requires the use of an active layer having an even thickness for the devices to be formed on it. More specifically, a single crystal Si substrate that is as thick as several hundreds micrometers has to be made as thin as several micrometers or less. Three techniques have been known for thinning a single crystal Si layer that include;

(1) polishing,
(2) local plasma etching, and
(3) selective etching.

It is difficult to achieve an even film thickness by means of the polishing technique above. Particularly, the mean deviation in the film thickness can be as large as tens of several percent to make the technique unfeasible when the film is thinned to an order of sub-micrometer. This problem will become more significant for wafers having a large diameter.

The technique of local plasma etching is typically used in combination with that of polishing. More specifically, the film is thinned by means of the technique of polishing to about 1 to 3$\mu$m, and the distribution of film thickness is determined by observing the film thickness at a number of points. Then, the film is subjected to an etching operation where the film is scanned with a plasma of $SF_6$ particles having a diameter of several millimeters, and correcting the distribution of film thickness until a desired film thickness is obtained. There has been a report that the distribution of film thickness can be confined within about ±10 nm or less by means of this technique. However, this process is accompanied by a drawback that, if foreign objects are present on the substrate in the form of particles during the plasma etching, they operate as so many etching masks to produce projections on the substrate when the etching operation is over.

Additionally, since the substrate shows a coarse surface immediately after the etching operation, a touch-polishing operation has to be conducted on the surface after the end of the plasma etching and the operation is controlled only in terms of its duration. Then, again the problem of deviations in the film thickness due to polishing arises. Still additionally, a polishing agent typically containing colloidal silica is used for the polishing operation. Hence the layer for making an active layer is directly scraped by the polishing agent so that a crushed and/or distorted layer may be produced. The throughput of the process can be significantly reduced when large wafers are treated because the duration of the plasma etching operation is prolonged as a function of the surface area of the wafer being processed.

The technique of (3) involves the use of a film configuration for the substrate to be thinned that comprises one, or more than one, film layers adapted to selective etching. For example, assume that a $P^+$-Si thin layer containing boron by more than $10^{19}/cm^3$ and a P-type Si thin layer are made to grow sequentially on a P-type substrate by means of epitaxial growth to produce a first substrate, which is then bonded to a second substrate with an insulation layer interposed therebetween, the insulation layer being typically an oxide film, and that the rear surface of the first substrate is made sufficiently thin in advance by scraping and polishing. Subsequently, the $P^+$-layer is exposed by selectively etching the overlying P-type layer and then the P-type substrate is exposed by selectively etching the $P^+$-layer, to produce an SOI structure. This technique is discussed in detail in a report by Maszara (W. P. Maszara, J. Electrochem. Soc., Vol. 138,341 (1991)).

While the selective etching technique is effective for producing a thin film with an even film thickness, it is accompanied by the drawbacks as identified below.

The selective etching ratio is not satisfactory and will be as low as $10^2$ at most.

A touch-polishing operation is required to smooth the surface after the etching operation because of the coarse surface produced by the etching operation. Therefore, the film thickness can lose the uniformity as it is reduced by polishing. Particularly, while the polishing operation is controlled by the duration of the operation, it is difficult to rigorously control the operation because the polishing rate can vary significantly from time to time. Thus, this problem becomes significant when forming an extremely thin SOI layer that is as thin as 100 nm.

The resulting SOI layer can show a poor crystallinity due to the use of a film forming technique that involve ion implantation and epitaxial or hetero-epitaxial growth on a Si layer that is densely doped with B. Additionally, the bonded surface of the substrate may show a degree of smoothness that is inferior relative to that of a conventional Si wafer (C. Harendt, et al., J. Elect. Mater. Vol. 20,267 (1991), H. Baumgart, et al., Extended Abstract of ECS first International Symposium of Wafer Bonding, pp-733 (1991), C. E. Hunt, Extended Abstract of ECS first International Symposium of Wafer Bonding, pp-696 (1991)). Still additionally, there is a problem that the selectivity of the selective etching technique heavily depends on the concentration difference among the impurities such as boron contained in the substrate and the steepness of the concentration profile of the impurities along the depth of the substrate. Therefore, if the bonding annealing is conducted at high temperature to improve the bonding strength of the layers, and the epitaxial growth is carried out also at high temperature to enhance the crystallinity of the SOI layer, the concentration profile of the impurities along the depth becomes flattened to reduce the selectivity of the etching operation. Simply stated, the improvement of the etching selectivity, and hence that of the crystallinity, and the improvement of the bonding strength are conflicting requirements that cannot be met at the same time.

Under these circumstances, the inventors of the present invention proposed a novel method of manufacturing a semiconductor article in Japanese Patent Application Laid-Open No. 5-21338. According to the invention, the proposed method is characterized by forming an article by arranging a nonporous single crystal semiconductor region on a porous single crystal semiconductor region, bonding the surface of a material carrying an insulating material thereon to the corresponding surface of said porous single crystal semiconductor region and subsequently removing said porous single crystal semiconductor region by etching.

T. Yonehara et al. who are the inventors of the present invention also reported a bonded SOI that is excellent in terms of even film thickness and crystallinity and adapted to batch processing (T. Yonehara et al., Appl. Phys. Lett. Vol. 64, 2108 (1994)). The proposed method of manufacturing a bonded SOI will be summarily described below by referring to FIGS. 16A through 16C of the accompanying drawings.

The proposed method uses a porous layer 902 formed on a first Si substrate 901 as a layer to be selectively etched. After forming a nonporous single crystal Si layer 903 on the porous layer 902 by epitaxial growth, it is bonded to a second substrate 904 with a Si oxide layer 905 interposed therebetween (FIG. 16A). Then, the porous Si layer is exposed over the entire surface area of the first substrate by scraping off the first substrate from the rear side (FIG. 16B). The exposed porous Si is then etched out by means of a selective etching solution typically containing KOH or $HF+H_2O_2$ (FIG. 16C). Since the selective etching ratio of the operation of etching the porous Si layer relative to the bulk Si layer (nonporous single crystal Si layer) can be made as high as hundreds of thousands with this technique, the nonporous single crystal Si layer formed on the porous layer in advance can be transferred onto the second substrate to produce a SOI substrate without reducing the thickness of the nonporous single crystal Si layer. Thus, the uniformity of the film thickness of the SOI substrate is determined during the epitaxial growth step. According to a report by Sato et al., since a CVD system adapted to an ordinary semiconductor process can be used for the epitaxial growth, a degree of uniformity of the film thickness as high as 100 nm ±2% can be realized. Additionally, the epitaxial Si layer shows an excellent crystallinity of about $3.5 \times 10^2/cm^2$.

Since the selectivity of any conventional selective etching technique heavily depends on the concentration difference among the impurities contained in the substrate and the steepness of the concentration profile of the impurities along the depth of the substrate as described above, the temperature of the heat treatment (for bonding, epitaxial growth, oxidation and so on) is limited to as low as 800° C. at most because the impurity concentration profile becomes flattened above that temperature limit. On the other hand, the etching rate of the proposed etching technique is mainly determined by the structural difference between the porous layer and the bulk layer so that the heat treatment is not subjected to such a rigorous limitation and temperature as high as 1,180° C. can be used. It is known that a heat treatment process conducted after the bonding operation can remarkably improve the bonding strength between wafers and reduce the size and number of voids given rise to on the bonding interface. Additionally, with a selective etching operation relying on the structural difference between the porous layer and the bulk layer, the uniformity of the film thickness is not adversely affected by fine particles that can be adhering to the porous Si layer.

However, a semiconductor substrate to be produced by way of a bonding process inevitably requires at least two wafers as starting materials, one of which is substantially wasted away in the course of polishing and etching to consume the limited natural resources. In other words, a SOI manufacturing process is required to realize low cost and economic feasibility in addition to an enhanced degree of process controllability and an improved uniformity of the film thickness.

Differently stated, the requirements of a process for manufacturing a high quality SOI substrate include an excellent reproducibility, an enhanced level of resource saving capability through the repeated use of a same wafer and low manufacturing cost.

Under such circumstances, the inventors of the present invention disclosed, in Japanese Patent Application Laid-Open No. 7-302889, a process for producing a semiconductor substrate in which two substrates are bonded together and the bonded substrates are separated at the porous layer and the separated one substrate is reused after eliminating the remaining porous layer. An example of this process is explained by reference to FIGS. 17A to 17C.

A surface layer of a first Si substrate 1001 is made porous to form porous layer 1002, and single crystal Si layer 1003 is formed thereon. This single crystal Si layer on the first Si substrate is bonded to the main face of second Si substrate 1004 with interposition of insulation layer 1005 (FIG. 17A). Then the wafer is separated at the porous layer (FIG. 17B). The bared porous Si layer on the second substrate surface is removed selectively to form a SOI substrate (FIG. 17C). First substrate 1001 can be used again after removal of the porous layer.

In the above process disclosed in Japanese Patent Application Laid-Open No. 7-302889, the substrates are separated by utilizing the brittleness of the porous silicon layer in comparison with the nonporous silicon layer, enabling reuse of the substrate used for semiconductor substrate production process, thus lower the production cost.

Japanese Patent Application Laid-Open No. 8-213645 discloses a process in which a semiconductor layer is formed, on a porous silicon layer, for a photoelectric conversion portion of a solar cell and the semiconductor layer is later separated at the porous layer to reuse the substrate having the porous silicon layer. In the process disclosed in Japanese Patent Application Laid-Open No. 8-213645, the semiconductor layer is bonded to a rigid jig with an adhesive, and the silicon substrate having the porous silicon layer is bonded to another rigid jig, and thereafter the jigs are pulled respectively in opposite directions to separate the semiconductor layer from the porous layer. In this method, the force is required for pulling the jigs to separate the entire face of the wafer in one stroke. Since the required pulling force is proportional to square of the wafer diameter, a larger wafer diameter requires a larger pulling force for the separation. Further, owing to the lower flexibility and to the difficulty in control of the force, the separation cannot easily be made at the desired region.

In production of a solar cell, the substrate for the element should be inexpensive in view of the production cost. Generally, silicon is used as the semiconductor constituting the solar cell. Single crystal silicon is most suitable from the standpoint of photoelectric conversion efficiency. However, amorphous silicon is advantageous for the larger cell area and the lower cell production cost. In recent years, polycrystalline silicon is being investigated for achieving a low production cost like the amorphous silicon, and a high energy-conversion efficiency like the single crystal silicon.

However, in the conventional methods employing single crystal silicon or polycrystal silicon, the crystal mass is sliced into substrate plates, so that the thickness of the substrate is limited to not less than 0.3 mm. This thickness is much larger than that necessary for absorbing the luminous energy sufficiently. Therefore, the material is not effectively utilized. For the lower production cost, further decrease of the thickness is desired. Recently, a method of silicon sheet formation by spinning has been disclosed in which liquid droplets of molten silicon are introduced into a mold to form a sheet. In this method, the thickness of the resulting sheet is about 0.1 to 0.2 mm, which is still thicker than the necessary and sufficient thickness (20 µm to 50 µm).

In another disclosure, a thin epitaxial layer, grown on a single crystal silicon substrate and separated (peeled) from the substrate, is used for the solar cell to achieve a higher energy conversion efficiency and a lower production cost (Milnes, A. G. and Feucht D. L.: "Peeled Film Technology Solar Cells", IEEE Photovoltaic Specialist Conference, p.338, 1975). In this method, an intermediate layer of SiGe is formed between the single crystal silicon as the substrate and the grown epitaxial layer, and after the heteroepitaxial growth, the grown layer is peeled by selective melting of the interlayer. However, heteroepitaxial growth is generally not advantageous in production cost because of probability of causing defects in the growth interface owing to the difference of the lattice constants, and because of the use of different materials.

U.S. Pat. No. 4,816,420 discloses a process for producing a thin crystal solar cell. In this process, a sheet-shaped crystal is formed through a mask, on a crystal substrate, by selective epitaxial growth and lateral growth, and the resulting sheet is separated from the substrate. In this method, the apertures of the mask are provided in lines, the crystal is grown by line seeding by selective epitaxial growth and lateral growth, and the crystal sheet is peeled mechanically by utilizing cleavage of the crystal. Therefore, at a size of the line seed larger than a certain limit, the larger contact area of the crystal sheet with the substrate tends to cause breakage of the crystal sheet during the peeling operation. In particular, in production of a solar cell of a larger area, this method cannot be applied practically even at the smallest aperture line width (practically about 1 µm) at the line length of several millimeters to several centimeters or more.

Japanese Patent Application Laid-Open No. 6-45622 applied for by the inventors of the present invention, discloses a solar cell production process in which a porous silicon layer is formed by anodization on a surface of a silicon wafer, the porous silicon layer is peeled and is fixed onto a metal substrate, and an epitaxial layer is formed on the porous layer to obtain a thin film crystal solar cell having excellent properties. However, this method is not satisfactory since the metal substrate is treated at a high temperature, and the epitaxial layer can be contaminated with impurities.

Japanese Patent Application Laid-Open No. 5-211128 discloses another process for separation of a substrate by use of a bubble layer which is different from the aforementioned porous layer, but has a function similar thereto. In this process, a bubble layer is formed in a silicon substrate by ion implantation. Crystal rearrangement and bubble coalescence are caused in the bubble layer by heat treatment, and the surface region of the silicon substrate (called a thin semiconductor film) is stripped off at the bubble layer. The thin semiconductor film in this disclosure means an outermost region of a bulk Si where no or few implanted ions are present.

This process, however, should be conducted at a temperature where the crystal rearrangement and the bubble coalescence occur effectively. It is not easy to establish the ion implantation conditions and to optimize the heat treatment of this process.

SUMMARY OF THE INVENTION

The object of the present invention is to provide a process for producing a semiconductor article comprising a separation of substrate where a part of the separated substrate is reused as the material for the semiconductor article.

According to an aspect of the present invention, there is provided a process for producing a semiconductor article comprising bonding a film onto a substrate having a porous semiconductor layer, and separating the film from the substrate at the porous semiconductor layer by applying a force to the film in a peeling direction.

According to another aspect of the present invention, there is provided a process for producing a semiconductor article comprising bonding a film onto a first substrate having a porous semiconductor layer and a nonporous semiconductor layer, and separating the nonporous semiconductor layer from the first substrate at the porous semiconductor layer by applying a force to the film in a peeling direction.

According to a further aspect of the present invention, there is provided a process for producing a semiconductor article comprising bonding a film onto a first substrate having a porous semiconductor layer and a nonporous semiconductor layer, separating the nonporous semiconductor layer from the first substrate at the porous semiconductor layer by applying a force to the film in a peeling direction, and bonding the separated nonporous semiconductor layer onto a second substrate.

The substrate recovered by the separation of the nonporous semiconductor layer and removal of the remaining porous layer from the first substrate can be used again as the material for the first substrate in the present invention. The reuse of the substrate can also be possible in the embodiment in which the porous layer is separated from the substrate.

In the process for producing a semiconductor article of the present invention, the substrate is separated by utilizing the fragility of the porous semiconductor layer. Further, in the present invention, the film is separated at the porous layer from the substrate by applying a force to the film in a direction of peeling the film from the substrate. The separation of the substrate can readily be conducted by peeling gradually the film from the edge of the substrate to concentrate the peeling force at the front of the peeling portion, whereas simple mechanical separation in a conventional method may cause breakage of the wafer. In the method of the present invention, the wafers are rarely broken.

Since the separation is conducted by utilizing simply the fragility of the porous layer in the present invention, complicated physical phenomena such as coalescence of bubbles in the heat treatment need not be considered for process optimization. Therefore, the substrate can be separated effectively in a simple manner.

According to the present invention, a layer or layers on the substrate can be transferred from the substrate onto a film. This method can be applied to various uses.

Further, the process for producing a semiconductor article of the present invention reuses the substrate repeatedly for effective material utilization, providing semiconductor articles such as SOI substrates, and solar cells at a low cost.

BRIEF DESCRIPTION OF THE DRAWINGS

FIGS. 9A, 9B, 9CA, 9CB, 9CC, 9DA, 9DB, and 9DC are schematic sectional views for explaining still another embodiment of the present invention.

DETAILED DESCRIPTION OF THE PREFERRED EMBODIMENTS

Figure 1A:
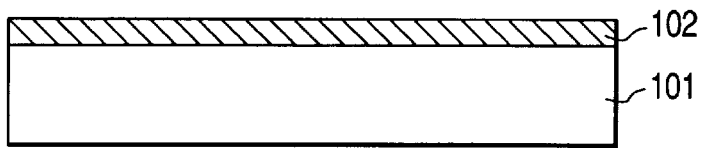
FIGS. 1A, 1B, 1C, and 1D are schematic sectional views for explaining the embodiment of the present invention.

Now, the present invention will be described in greater detail in terms of preferred modes and different phases of carrying out the invention. However, it will be appreciated that the present invention is by no means limited thereto and covers any other modes of realizing the invention that can be used for the purpose of the invention.

[Porous Semiconductor Layer]

Silicon (Si) is suitably used as the material for the porous semiconductor layer.

Porous Si was firstly discovered in 1956 by Uhlir et al. who were studying a process of electropolishing a semiconductor material (A. Uhlir, Bell Syst. Tech. J., Vol. 35,333 (1956)). Porous Si can be prepared through anodization of a Si substrate in a HF solution. Unagami reports as a result of his study on the dissolutive reaction of Si in a Si anodization process that the existence of holes is required for anodization of Si and the reaction proceeds in a manner as described below (T. Unagami, J. Electrochem. Soc., Vol. 127,476 (1980)).

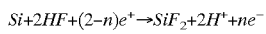

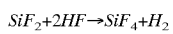

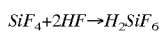

or

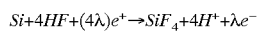

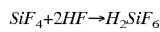

where $e^+$ and $e^-$ represent respectively a hole and an electron and n and $\lambda$ represent respective numbers of holes required for dissolving a single Si atom. The report says that porous Si is formed when the condition of $n>2$ or $\lambda>4$ is met.

Although a conclusion that can be drawn from the above is that P-type Si can be made porous under the existence of holes whereas N-type Si cannot be made porous, in reality, both N-type Si and P-type Si can be turned porous under certain conditions.

According to the invention, single crystal porous Si can be formed through anodization of a single crystal Si substrate typically in an HF solution. A porous Si layer shows a spongy structure where pores with a diameter between $10^{-1}$ and 10 nm are arranged with intervals between $10^{-1}$ and 10 nm. The density of porous Si can be made to vary between 2.1 and 0.6 g/cm$^3$ by varying the concentration of the HF solution between 50 and 20% and/or by varying the current density in contrast to the density of single crystal Si that is equal to 2.33 g/cm$^3$. In other words, the porosity of porous Si is variable. While porous Si can be made to show a density less than a half of that of single crystal Si, it maintains the properties as single crystal Si so that a single crystal Si layer can be formed by epitaxial growth on a porous Si layer.

A porous Si layer has a density that is less than the density of a single crystal Si layer because it contains a large number of voids in the inside. Consequently, a porous Si layer shows a dramatically large surface area relative to the volume it occupies. This means that a porous Si layer can be etched at a rate by far greater than the rate at which an ordinary single crystal Si layer is normally etched.

While porous Si shows a mechanical strength that varies depending on its porosity, it is presumably lower than that of bulk Si. For instance, if a porous Si layer shows a porosity of 50%, it may be safe to assume that its mechanical strength is about a half of that of a comparable bulk Si layer. In other words, when a wafer formed by bonding a pair of substrates is subjected to compressive, tensile or shearing force, the porous Si layer arranged therebetween will be destroyed first. If the layer has a large porosity, it will be destroyed with little effort. In the present invention, the porous layer can be formed in layers of different porosities by varying the current density during the anodization. Otherwise, porous layer can be formed in a thickness larger than a high impurity concentration layer by forming a high impurity concentration layer on one face of the Si substrate and anodizing this face.

There are reports saying that micro-cavities having a diameter between several nanometers and tens of several namometers can be formed in a piece of bulk Si to a concentration of $10^{16-17}$/cm$^3$ by implanting helium or hydrogen ions, and heat treating the piece particularly in the area where ions are implanted (see, inter alia, A. Van Veen, C. C. Griffioen and J. H. Evans, Mat. Res. Soc. Symp. Proc. 107 (1988, Material Res. Soc. Pittsburgh, Pa.) p. 449). Recently, research has been conducted for utilizing a group of micro-cavities for a gettering site of a metal impurity.

In an experiment conducted by V. Raineri and S. U. Campisano, helium ions were implanted into a substrate of bulk Si, which was then heat treated to form a group of micro-cavities therein and subsequently subjected to an oxidation process where a groove was formed in the substrate to expose a lateral side of the micro-cavity group. They report that the micro-cavity group was selectively oxidized to produce a buried Si oxide layer, which showed a SOI structure (V. Raineri and S. U. Campisano, Appl. Phys. Lett. 66 (1995) p. 3654). However, with the technique they employed, the thickness of the surface Si layer and that of the buried Si oxide layer are limited to respective ranges that allow both the formation of a micro-cavity group and relaxation of the stress generated by the increased volume at the time of oxidation. An operation of forming a groove is necessary for selective oxidation and so that a SOI structure cannot be produced on the entire surface of the substrate. The porous semiconductor layer of the present invention includes such a layer having micro-cavities or micro-bubbles.

[Film]

The film employed in the present invention includes adhesive resin films such as polyimide films, electroconductive resin films, electroconductive metal films, films which change adhesiveness by action of optical energy, electronic rays, heat, or the like, and aluminum foil-containing glass cloth film, but is not limited thereto. Specific examples are Tefzel films produced by DuPont Co., aluminum foil glass cloth tapes (No. 363) and heat-resistant aluminum foil tapes (No. 433) produced by Scotch Co., and release tapes (No. 3200A, No. 31RH, and BT-315) produced by Nitto Denko Co. For bonding the film to the substrate, an adhesive may be employed to supplement the adhesion force, if the adhesive force is not sufficient. The adhesive includes resin type adhesives like epoxy type adhesives, waxes, SOG (spin on glass). The adhesive may be replaced by an electroconductive paste resin component which is heated to remove a volatile component.

The thickness of the film in the present invention is selected depending on the material and properties of the film employed, and is in the range preferably from 5 $\mu$m to 3 cm, more preferably from 10 $\mu$m to 1 cm.

[Nonporous Semiconductor Layer]

For the purpose of the present invention, a nonporous semiconductor layer can be formed preferably by using a material selected from single crystal Si, polycrystalline Si, noncrystalline Si and compound semiconductors including GaAs, InP, GaAsP, GaAlAs, InAs, AlGaSb, InGaAs, ZnS, CdSe, CdTe and SiGe. A nonporous semiconductor layer that can be used for the purpose of the present invention may substantially contain one or more than one FETs (field effect transistors).

[First Substrate]

For the purpose of the present invention, the first substrate may be prepared by forming a nonporous semiconductor layer on the porous silicon layer in the silicon substrate or by forming a porous silicon layer in part of a silicon substrate having therein a nonporous semiconductor substrate.

Further, the first substrate includes not only substrates comprised of a silicon substrate having an ion implantation layer generating Micro-bubbles formed therein and a nonporous semiconductor layer, but also substrates having additionally an insulation layer such as a nitride film and an oxide film, substrates having an epitaxial semiconductor layer and an insulation layer formed on a silicon substrate and an ion implantation layer formed by subsequent ion implantation into the silicon substrate, substrates having a nonporous semiconductor layer formed on the silicon substrate and an ion implantation layer formed by subsequent ion implantation, and similar substrates.

The epitaxial growth method for the silicon layer formation on the porous layer in the present invention includes thermal CVD, LPCVD, sputtering, plasma CVD, photo-assisted CVD, and liquid phase growth.

In vapor phase growth such as thermal CVD, LPCVD, plasma CVD, and photo-assisted CVD, the source gas typically includes silanes and halogenated silanes such as $SiH_2Cl_2$, $SiCl_4$, $SiHCl_3$, $SiH_4$, $Si_2H_6$, $SiH_2F_2$, and $Si_2F_6$. To the above source gas, hydrogen ($H_2$) is added as the carrier gas or for reducing atmosphere formation. The ratio of the source gas to the hydrogen gas is selected suitably depending on the layer formation method, the kind of the source gas, and the layer formation conditions, and is in the range preferably from 1:10 to 1:1000 (introduction flow rate ratio), more preferably from 1:20 to 1:800.

In the liquid phase growth, silicon is dissolved in a solvent like Ga, In, Sb, Bi, and Sn under an $H_2$ or $N_2$ atmosphere, and the epitaxial growth is allowed to proceed by gradually cooling the solvent or causing a temperature difference in the solvent.

For formation of a compound semiconductor layer on the porous layer, MOCVD, MBE, liquid phase growth, or the like is employed. The source material for the crystal growth is selected suitably depending on the kind of the compound semiconductor and the growth method. For example, for GaAs formation, $Ga(CH_3)_3$, $AsH_3$, $Al(CH_3)_3$, or the like is used in MOCVD. In liquid phase growth, the growth is conducted by dissolving As, or As and Al in Ga as the solvent.

In the epitaxial growth in the present invention, the temperature and the pressure are selected depending on the formation process and the source gas. In the silicon growth in a usual thermal CVD, for example, the temperature is preferably in the range of from about 800° C. to 1250° C., more preferably from 850° C. to 1200° C. In the liquid growth, the temperature depends on the solvent. In growth of silicon with Sn or In as the solvent, the temperature is preferably in the range of from 600° C. to 1050° C. In growth of GaAs with Ga as the solvent, the temperature is preferably in the range from 650° C. to 850° C. In growth of GaAs by MOCVD, the temperature is preferably in the range of from 650° C. to 900° C. In a low-temperature process like plasma CVD, the temperature is in the range preferably from 200° C. to 600° C., more preferably from 200° C. to 500° C. The pressure is in the range preferably from $10^{-2}$ Torr to 760 Torr, more preferably from $10^{-1}$ Torr to 760 Torr with exception of MBE. In MBE, the evacuation pressure is preferably not higher than $10^{-5}$ Torr, more preferably not higher than $10^{-6}$ Torr.

[Second Substrate]

The second substrate onto which the nonporous semiconductor layer is to be transferred includes semiconductor substrates such as single crystal silicon substrates, substrates having an insulation film such as an oxide film (including thermal oxidation film) and a nitride film, light-transmissive substrates such as a silica glass substrate and a glass substrate, metal substrates, insulating substrates such as alumina, and like substrates. The second substrate is selected depending on the application of the semiconductor article.

[Bonding of the Non-porous Semiconductor Layer and the Second Substrate]

In the present invention, the aforementioned non-porous semiconductor layer on the film is bonded to a second substrate to obtain a multiple layer structure with the nonporous semiconductor layer placed inside. The multiple layer structure having a nonporous semiconductor layer placed inside, in the present invention, includes not only the structures in which the nonporous semiconductor layer on the film separated from the first substrate is bonded directly to the second substrate, but also the structures in which an oxide film, a nitride film, or the like formed on the surface of the nonporous semiconductor layer surface is bonded to the second substrate. That is, the structure having a nonporous semiconductor layer placed inside means a multiple layer structure in which the nonporous semiconductor layer is placed inside the film or the supporting member in the multiple layer structure.

The non-porous semiconductor layer and the second substrate can be bonded together, for example, at room temperature by making the both bonding faces flat and bringing both into close contact with each other. Anode bonding, pressing, or heat treatment may be employed for stronger bonding.

[Removal of the Porous Layer]

After separating the multilayer structure that has been prepared by bonding first and second substrates together along the porous Si layer, the residual porous Si remaining on the substrates can be selectively removed on the basis of the fact that the porous Si layer has a low mechanical strength and a large surface area. Methods that can be used for selectively removing the remaining porous Si include mechanical techniques such as scraping and polishing, chemical etching using an etching solution and ion etching (such as reactive ion etching).

Etching solutions that can be used for a process of selectively removing the porous Si by means of an etching solution include, beside a mixture solution of 49% hydrofluoric acid and 30% aqueous hydrogen peroxide, hydrofluoric acid, a mixture solution obtained by adding alcohol to hydrofluoric acid, a mixture solution obtained by adding alcohol and aqueous hydrogen peroxide to hydrofluoric acid, buffered hydrofluoric acid, a mixture solution obtained by adding alcohol to buffered hydrofluoric acid, a mixture solution obtained by adding aqueous hydrogen peroxide to buffered hydrofluoric acid, a mixture solution obtained by adding alcohol and aqueous hydrogen peroxide to buffered hydrofluoric acid and a mixture solution of hydrofluoric acid, nitric acid and acetic acid.

The semiconductor article having the transferred nonporous semiconductor layer may preferably be heat treated in a hydrogen-containing atmosphere, subsequently to the selective removal of the porous layer, to improve the flatness of the nonporous semiconductor layer.

The embodiments of the present invention are described specifically by reference to drawings.

Embodiment 1

The process for the semiconductor article production in this embodiment comprises the steps of forming a porous layer at least on a main face of a substrate, bonding a film onto the surface of the porous layer, and separating the substrate side and the film side at the porous layer. The process is explained by reference to FIGS. 1A to 1D.

Figure 1B:
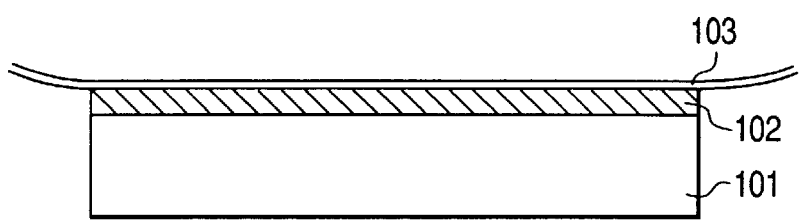
Figure 1C:
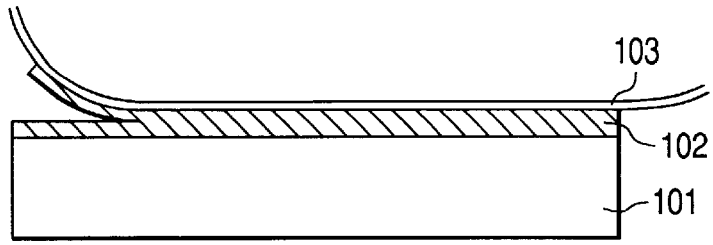
Figure 1D:
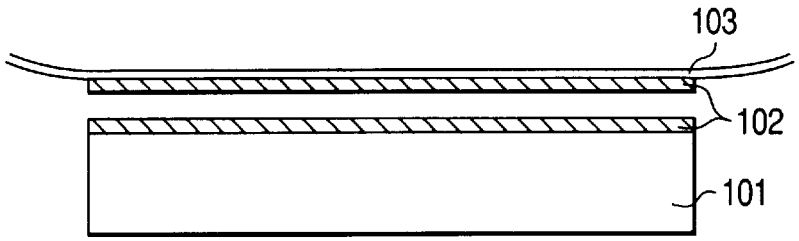

Porous Si layer 102 is formed on the main surface of first single crystal Si substrate 101 (FIG. 1A). Onto the surface of the porous Si layer, flexible adherent film 103, or a flexible film with an adhesive is bonded (FIG. 1B). Naturally, the film may be bonded with an electroconductive paste in this embodiment and other embodiments described later. Then, the flexible film is pealed from first single crystal Si substrate 101 (FIG. 1C) to separate the substrate side and the film side at the porous Si layer. Thus a thin porous Si film is separated from substrate 101 (FIG. 1D). Porous Si layer 102 on film 103 is applicable to various uses such as light emitting elements, and gas adsorption sensors.

Single crystal Si substrate 101 can be reused repeatedly as the substrate after the remaining porous Si layer is removed.

If the surface of single crystal Si substrate 101 becomes unacceptably rough, the surface is smoothed out before reuse.

Embodiment 2

The process in this embodiment comprises the steps of forming a porous layer at least on a main face of a first substrate, forming a nonporous layer on the porous layer, bonding a film on the surface of the nonporous layer, and separating the nonporous layer together with the film from the first substrate at the porous layer. The process is explained by reference to FIGS. 2A to 2E.

Figure 2A:
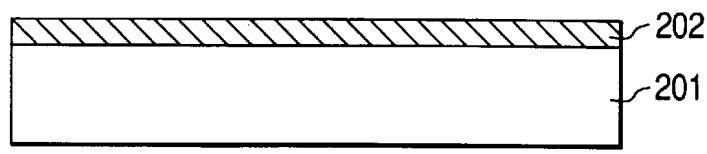
FIGS. 2A, 2B, 2C, 2D, and 2E are schematic sectional views for explaining another embodiment of the present invention.
Figure 2B:
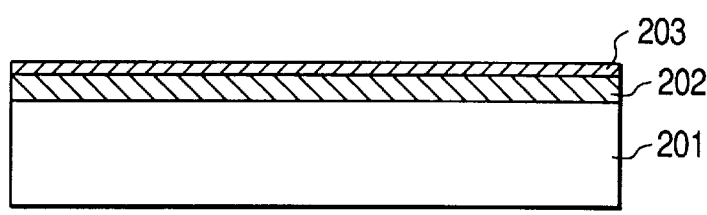
Figure 2C:
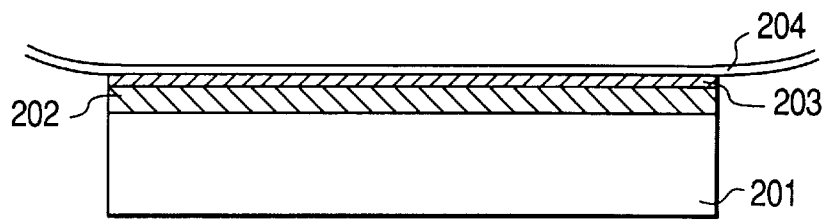
Figure 2D:
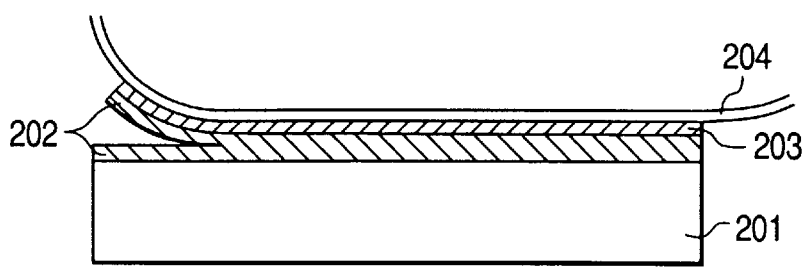
Figure 2E:
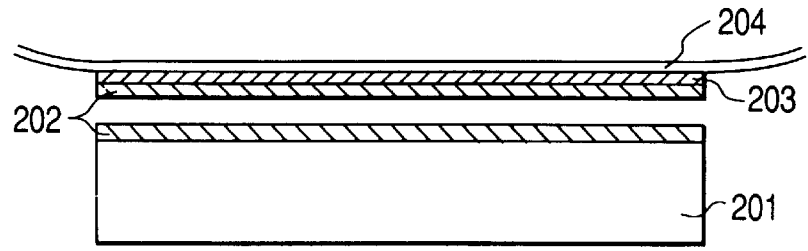

Porous Si layer 202 is formed on a main face of first single crystal Si substrate 201 (FIG. 2A). On the surface of the porous Si, nonporous layer 203 is formed (FIG. 2B). Onto the surface of the nonporous layer, flexible adherent film 204, or a flexible film with an adhesive is bonded (FIG. 2C). Then, a force is applied in a direction of peeling the flexible film from first substrate 201 (FIG. 2D). Thereby, the nonporous layer and the porous Si layer together with the film are separated from the substrate side at the porous Si layer. Thus, the porous Si/nonporous layer is separated from substrate 201 (FIG. 2E). Porous Si/nonporous layer is applicable to various uses such as light emitting elements, and sensors.

First single crystal Si substrate 201 can be reused repeatedly as the substrate after the remaining porous Si layer is removed. If the surface of single crystal Si substrate 201 becomes unacceptably rough, the surface is smoothed out before reuse.

Embodiment 3

The process in this embodiment comprises the steps of forming a porous layer at least inside a first substrate with the surface of the substrate kept nonporous, bonding a film onto the nonporous surface of the first substrate, and separating the first substrate side and the film side. The process is explained by reference to FIGS. 3A to 3D.

Figure 3A:
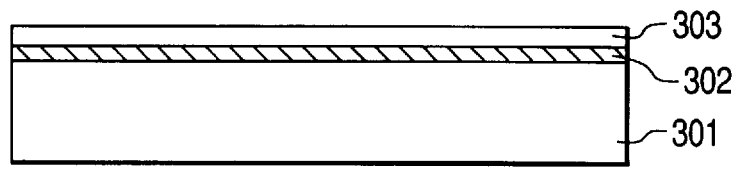
FIGS. 3A, 3B, 3C, and 3D are schematic sectional views for explaining still another embodiment of the present invention.
Figure 3B:
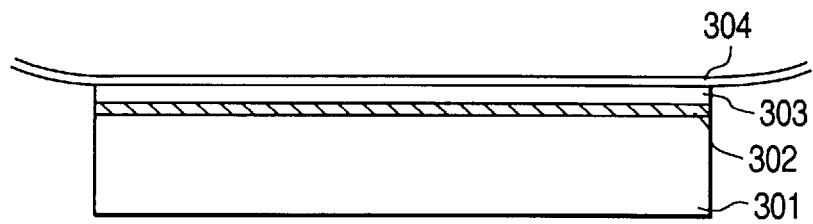
Figure 3C:
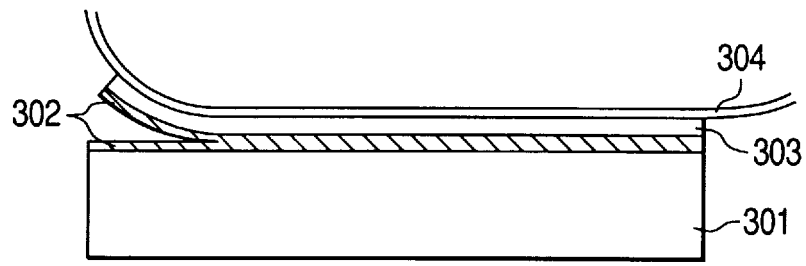
Figure 3D:
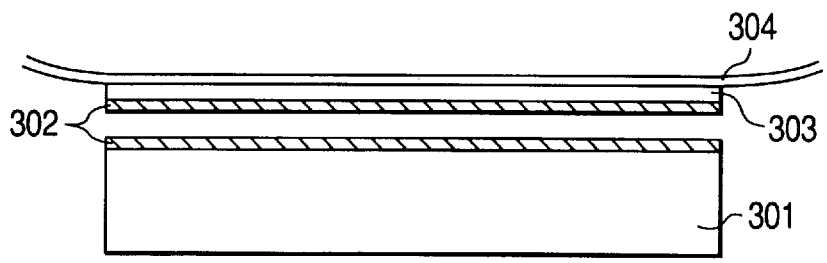

Porous ion implantation layer 302 is formed in the interior of first single crystal Si substrate 301 by implanting ions from the surface layer side of the substrate (FIG. 3A). The first substrate may have a nonporous layer formed preliminarily on the surface thereof. In other words, a nonporous layer may be deposited preliminarily on the substrate. Otherwise, a nonporous layer may be formed after the ion implantation. Prior to the ion implantation, a protection film such as an $SiO_2$ film is preferably formed on the main surface layer to prevent roughening of the surface. Onto the main surface of the first Si substrate, flexible adherent film 304 or a flexible film with an adhesive is bonded (FIG. 3B). Thereafter, the flexible film is peeled from first single crystal Si substrate 301 (FIG. 3C) to separate the first substrate side and the film side at the porous ion implantation layer. Thus the porous layer 303 is separated from substrate 301 (FIG. 3D).

First single crystal Si substrate 301 can be reused repeatedly as the substrate after the remaining porous Si layer is removed therefrom. If the surface of single crystal Si substrate 301 becomes unacceptably, rough the surface is smoothed out before reuse.

Embodiment 4

The process in this embodiment comprises the steps of bonding a film onto a first substrate having a porous semiconductor layer and a nonporous semiconductor layer, separating the nonporous semiconductor layer from the first substrate at the porous semiconductor layer by applying a force to the film in a peeling direction, and bonding the separated nonporous semiconductor layer onto a second substrate. The process is explained by reference to FIG. 4.

Figure 4:
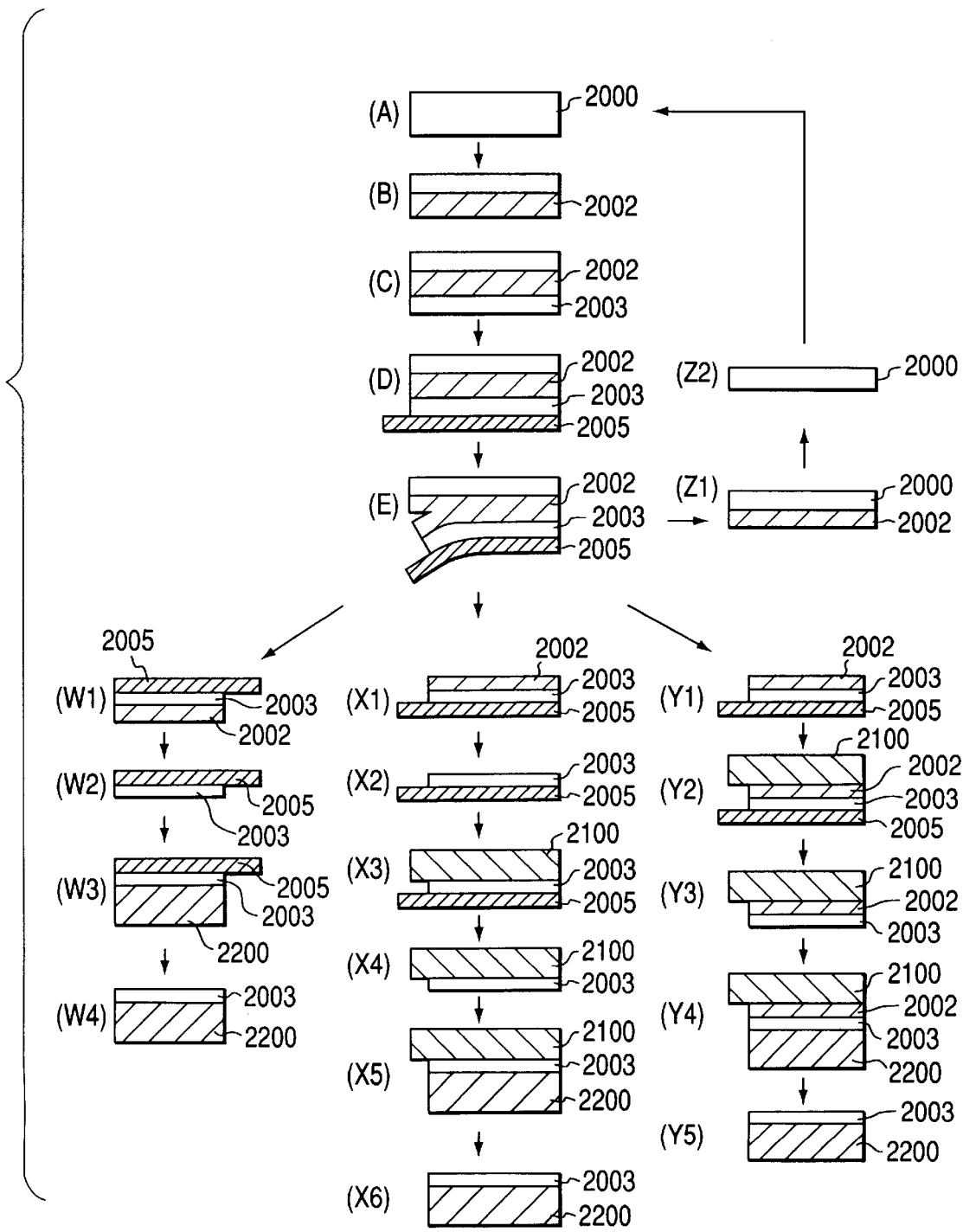
FIG. 4 shows schematic sectional views for explaining the process of still another embodiment of the present invention.

First substrate ((C) in FIG. 4) is provided which has a porous semiconductor layer 2002 and nonporous semiconductor layer 2003. The first substrate can be prepared, for example, by making single crystal silicon substrate 2000 ((A) in FIG. 4) porous to form porous layer 2002 ((B) in FIG. 4) and subsequently forming nonporous semiconductor layer 2003 (e.g., epitaxial Si) ((C) in FIG. 4), or by forming micro-bubbles by ion implantation technique as mentioned before in the explanation of the first substrate.

Film 2005 is bonded onto the side of nonporous semiconductor layer 2003 ((D) in FIG. 4). The face onto which film 2005 is to be bonded may be the face of nonporous semiconductor layer 2003 itself, or the surface of an insulation layer, such as an $SiO_2$ layer (e.g., thermal oxidation film) and an SiN layer, formed on nonporous semiconductor layer 2003. The layer to be formed on nonporous semiconductor layer 2003 is selected suitably depending on the properties required to the intended semiconductor article.

Then a force is applied to film 2005 in a direction to peel film 2005 to separate the first substrate ((E) in FIG. 4). From the separated substrate comprising the single crystal silicon base plate 2000, porous semiconductor layer (Si) 2002 ((Z1) in FIG. 4) is removed to regenerate single crystal silicon base plate 2000 ((Z2) in FIG. 4) for reuse as the base material for subsequent production of the semiconductor article ((Z2)→(A) in FIG. 4).

The other separated substrate of the side of film 2005 comprising nonporous semiconductor layer 2003 is treated by any of the three methods. In one method shown by the drawings W1 to W4, porous semiconductor layer 2002 remaining on the face reverse to film 2005 is removed, the nonporous semiconductor layer 2003 is bonded to second substrate 2200, and film 2005 is removed. In the methods shown by the drawings X1 to X6, and Y1 to Y5, the surface of a member on the face reverse to film 2005 (e.g., nonporous semiconductor layer 2003, and porous semiconductor layer 2002) is bonded to supporting member 2100 (a film, a sheet, a base plate, or the like), film 2005 is removed, nonporous semiconductor layer 2003 bared by the removal of film 2005 is bonded to second substrate 2200, and then supporting member 2100 is removed. The method of X1 to X6 and the method of Y1 to Y5 are different in that porous semiconductor layer 2002 is removed before bonding to supporting member 2100 ((X2) in FIG. 4), or after the bonding ((Y5) in FIG. 4).

According to this embodiment, semiconductor members can be produced which are suitable for SOI substrates, sensors, solar cells, liquid crystal display devices, and so forth.

Embodiment 5

The process in this embodiment comprises the steps of forming a porous layer at least on the main face of a first substrate, forming a nonporous layer on the porous layer, bonding a film onto the surface of the nonporous layer, and separating the first substrate side and the film side at the porous layer, transferring the multilayer structure of the film side onto a supporting member (or a film), bonding the surface side of the nonporous layer of the transferred multilayer structure to a second substrate, and removing the porous layer of the multilayer structure.

In the above steps, the multilayer structure of the film side can be transferred onto a supporting member (or a film), and the surface side of the nonporous layer of the transferred multilayer structure can be bonded to a second substrate in such a manner that the multilayer structure is bonded to a supporting member having adhesive power stronger than that of the film, the film is peeled, and the surface side of the nonporous layer after the peeling is bonded to the second substrate. Thereafter the supporting member (or the film) is peeled off, or the film is etched off.

In the above steps, a film which becomes less adherent by irradiation of ultraviolet rays may be employed to utilize initial higher adhesive force in peeling of a layer or a multilayer structure, and to utilize the adhesive force weakened by ultraviolet ray irradiation in the transfer onto the supporting member or film by peeling from the structure.

Otherwise, without using the supporting member, the film may be dissolved by etching in a liquid, or the film which becomes less adherent on ultraviolet ray irradiation is used and after ultraviolet ray irradiation the film is peeled in a liquid. After the peeling in the liquid, the remaining multilayer structure is collected by a mesh, a net, or the like, and is placed on a second substrate to bond the surface of the nonporous layer of the multilayer structure to the second substrate.

The above steps can be employed similarly in other embodiments.

The process of this embodiment is described specifically by reference to FIGS. 5A to 5GB.

Figure 5A:
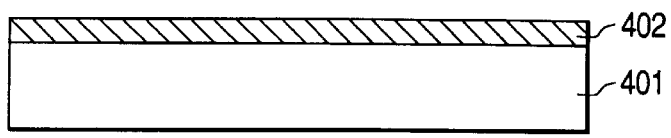
FIGS. 5A, 5B, 5C, 5D, 5E, 5FA, 5FB, 5GA, and 5GB are schematic sectional views for explaining still another embodiment of the present invention.
Figure 5B:
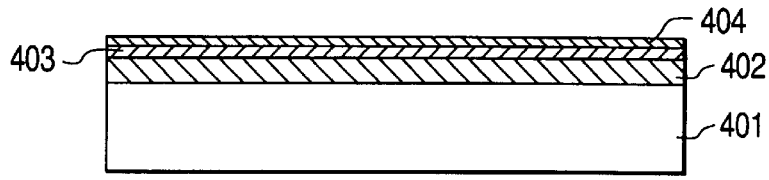
Figure 5C:
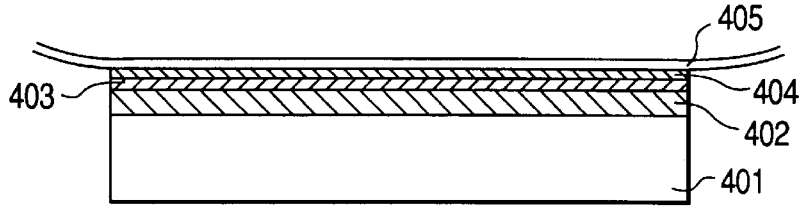
Figure 5D:
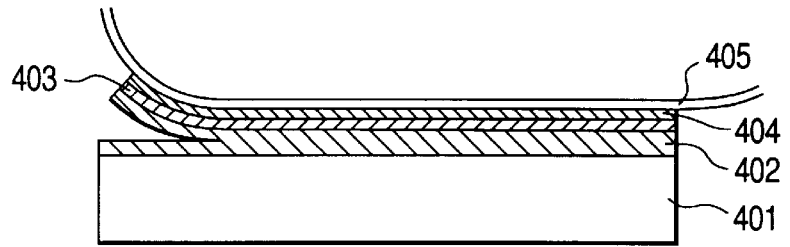
Figure 5E:
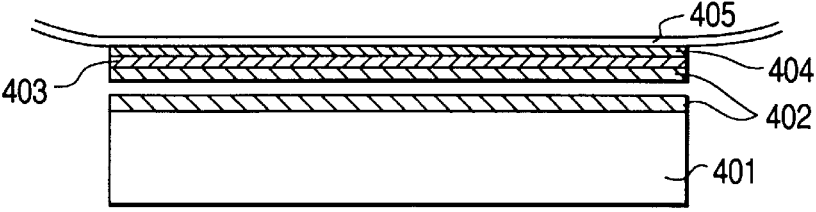

Porous Si layer 402 is formed on the main surface layer of a first single crystal Si substrate 401 (FIG. 5A). On the surface of porous Si layer 402, at least one nonporous layer 403 is formed (FIG. 5B). Nonporous layer 403 is selected suitably from single crystal Si, polycrystal Si, amorphous Si, metal films, thin compound semiconductor films, superconductive thin films, and so forth. The film may be formed in an element structure such as MOSFET. As the outermost layer, $SiO_2$ 404 is preferably formed to displace the bonding interface from the active layer. Flexible adherent film 405 or a flexible film with an adhesive is bonded to the surface of the nonporous layer (FIG. 5C). Then, flexible film 405 is peeled from first single crystal Si substrate 401 (FIG. 5D) to separate the first substrate side and the film side at the porous Si layer. Thus, porous Si layer 402/nonporous layer 403/$SiO_2$ 404 are separated from substrate 401 (FIG. 5E).

Figure 5F:
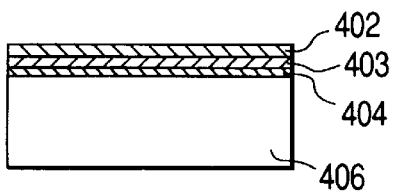
Figure 5F:
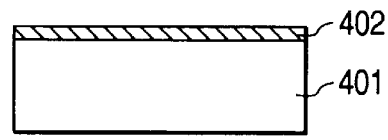

After separation of porous Si layer 402/nonporous layer 403/$SiO_2$ 404, the surface of $SiO_2$ 404 is brought into close contact with second substrate 406 at room temperature as shown in FIGS. 5FA and 5FB. Then the bonding may be fortified by anode-junctioning, pressing, heating, or combination thereof.

In the case where single crystal Si is formed by deposition, Si oxide is preferably formed by thermal oxidation or a like method on the surface of the single crystal Si before the bonding. The second substrate may be selected from simple Si substrates, Si substrates having a Si oxide film formed thereon, and light-transmissive substrates like quartz, but is not limited thereto provided that the bonding face is sufficiently flat. FIGS. 5FA and 5FB show bonding with interposition of insulation layer 404. However, when nonporous thin film 403 is not formed from Si, or when the second substrate is not made of Si, insulation layer 404 may be omitted. In the bonding, a thin insulation plate may be sandwiched.

Subsequently, porous Si layer 402 is selectively removed. When the nonporous thin film is comprised of single crystal Si, porous Si layer 402 only is removed by non-electrolytic wet chemical etching by use of at least one of a usual Si etching solution, hydrofluoric acid which is a selective porous Si etchant, a mixture of hydrofluoric acid and at least one of alcohol and an aqueous hydrogen peroxide solution, buffered hydrofluoric acid, a mixture of buffered hydrofluoric acid and at least one of alcohol and an aqueous hydrogen peroxide solution. Thereby, the film formed previously on the porous film on the first substrate is left on the second substrate. As mentioned before, the porous Si which has a extremely large surface area can be etched selectively even with an usual Si etching solution. Otherwise, thin porous Si layer 402 is selectively removed by selective polishing by utilizing thin nonporous layer 403 as the polish stopper.

In the case where a compound semiconductor layer is formed on the porous layer, porous Si layer 402 only is removed by chemical etching by use of an etching solution which etches Si at a higher rate than the compound semiconductor to leave the single crystal compound semiconductor layer 403 on the second substrate 406. Otherwise, thin porous Si layer 402 is selectively removed by selective polishing by utilizing single crystal compound semiconductor layer 403 as the polish stopper.

Figure 5G:
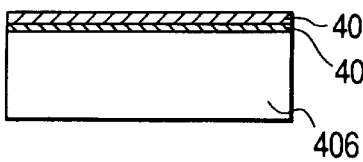
Figure 5G:

FIGS. 5GA and 5GB show the semiconductor substrates obtained according to the present invention. On second substrate 406, the nonporous thin film such as thin single crystal Si film 403 is formed flat in a thin layer in a large area over the entire wafer. By use of an insulating substrate as second substrate 406, the semiconductor substrate prepared from the substrate is useful for production of electronic elements separated by insulation.

First single crystal Si substrate 401 can be reused repeatedly as the first substrate or the second substrate after the remaining porous Si layer is removed therefrom. If the surface of single crystal Si substrate 101 becomes unacceptably rough, the surface is smoothed out before reuse as the first or second substrate.

The steps explained in this embodiment can be employed also in other embodiments.

Embodiment 6

The process in this embodiment comprises steps of forming a porous layer at least in the interior of a first substrate in the main face side thereof with the surface kept nonporous, bonding a film onto the surface of the nonporous layer, and separating the first substrate side and the film side at the porous layer, transferring the multilayer structure of the film side onto a supporting member, bonding the surface side of the transferred multilayer structure to a second substrate, and removing the porous layer of the multilayer structure. The process is explained by reference to FIGS. 6A to 6FB.

Figure 6A:
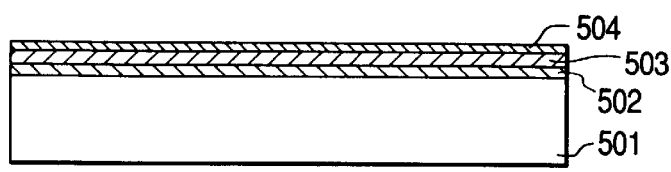
FIGS. 6A, 6B, 6C, 6D, 6EA, 6EB, 6FA, and 6FB are schematic sectional views for explaining still another embodiment of the present invention.

Porous ion implantation layer 502 is formed in the interior of first single crystal Si substrate 501 by implanting ions of at least one element of rare gases, hydrogen, and nitrogen from the main surface layer side of the substrate with nonporous layer 503 kept on the surface (FIG. 6A). Prior to the ion implantation, a protection film 504 such as a $SiO_2$ film is preferably formed on the main surface layer to prevent roughening of the surface. The formation of $SiO_2$ 504 is advantageous also in displacing the bonding interface from the active layer.

Figure 6B:
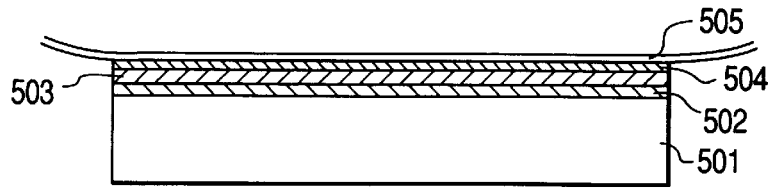
Figure 6C:
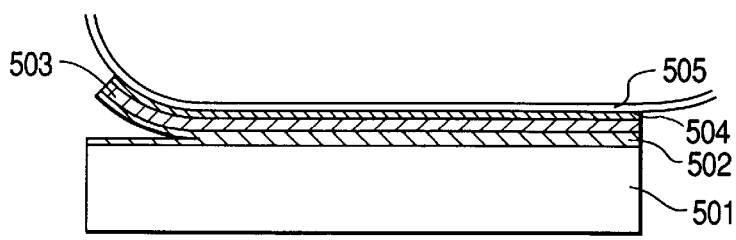
Figure 6D:
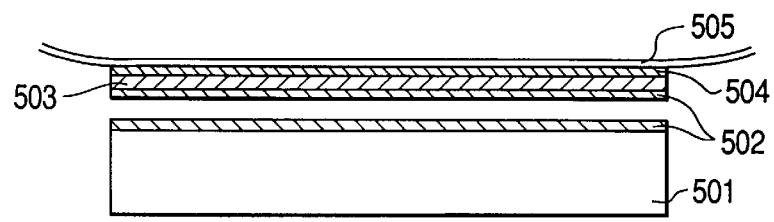

Onto the surface of the nonporous layer, flexible adherent film 505 or a flexible film with an adhesive is bonded (FIG. 6B). Thereafter, flexible film 505 is peeled from first single crystal Si substrate 501 (FIG. 6C) to separate the first substrate side and the film side at porous ion implantation layer 502. Thus porous ion implantation layer 502/nonporous layer 503/$SiO_2$ layer 504 are separated from substrate 501 (FIG. 6D).

Figure 6E:
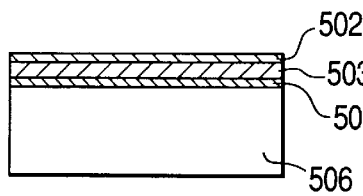
Figure 6E:
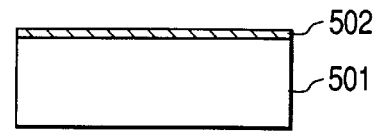

After separation of porous ion implantation layer 502/nonporous layer 503/$SiO_2$ layer 504 from film 505, second substrate 506 is bonded to the surface of $SiO_2$ 504 as shown in FIG. 6EA. Further, porous ion implantation layer 502 is selectively removed in the same manner as mentioned before.

Figure 6F:
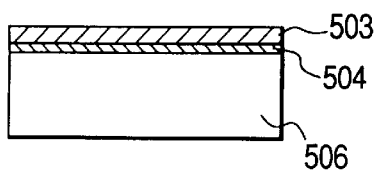
Figure 6F:
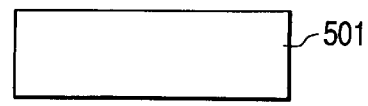

FIGS. 6FA and 6FB show the semiconductor substrates obtained according to this embodiment.

First single crystal Si substrate 501 can be reused repeatedly as the first single crystal substrate or the second substrate after the remaining porous ion implantation layer is removed therefrom.

Embodiment 7

The process in this embodiment comprises steps of forming a porous layer at least in the interior of a first substrate in the main face side thereof with the surface kept nonporous, forming a nonporous layer on the nonporous surface of the substrate, bonding a film onto the surface of the nonporous layer, and separating the first substrate side and the film side at the porous layer, transferring the multilayer structure of the film side onto a supporting member, bonding the surface side of an insulation layer of the transferred multilayer structure to a second substrate, and removing the porous layer of the multilayer structure. The process is explained by reference to FIGS. 7A to 7GB.

Figure 7A:
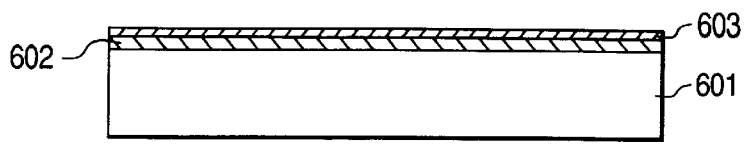
FIGS. 7A, 7B, 7C, 7D, 7E, 7FA, 7FB, 7GA, and 7GB are schematic sectional views for explaining still another embodiment of the present invention.
Figure 7B:
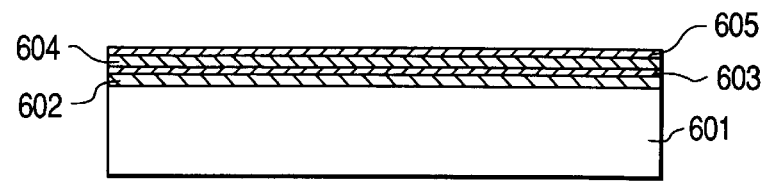

Porous ion implantation layer 602 is formed in the interior of first single crystal Si substrate 601 by implanting ions of at least one element of rare gases, hydrogen, and nitrogen from the surface layer side of the substrate with nonporous layer 603 kept on the surface (FIG. 7A). Prior to the ion implantation, a protection film 604 such as a $SiO_2$ film is preferably formed on the main surface layer to prevent roughening of the surface. Additionally, at least one nonporous layer 604 is formed on the nonporous layer on the surface of first single crystal Si substrate 601 (FIG. 7B).

Prior to the ion implantation, a protection film 605 such as an $SiO_2$ film is preferably formed on the main surface layer to prevent roughening of the surface. The formation of $SiO_2$ 605 is advantageous also in displacing the bonding interface from the active layer.

Figure 7C:
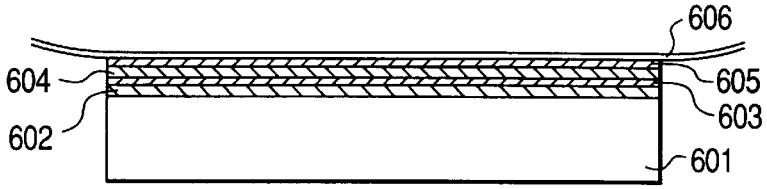
Figure 7D:
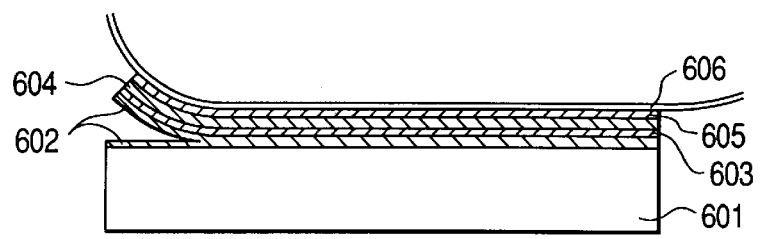
Figure 7E:
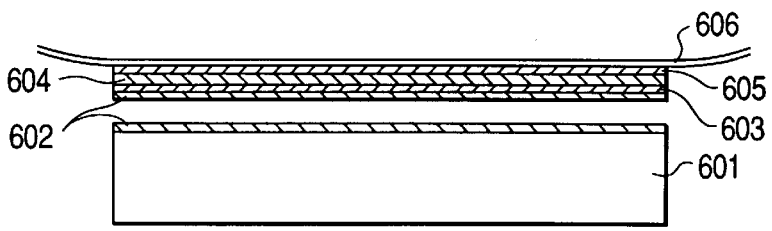

Onto the surface of the nonporous layer, flexible adherent film 606 or a flexible film with an adhesive is bonded (FIG. 7C). Thereafter, flexible film 606 is peeled from first single crystal Si substrate 601 (FIG. 7D) to separate the first substrate side and the film side at porous ion implantation layer 602. Thus, porous ion implantation layer 602/nonporous layer 603/nonporous thin film 604/$SiO_2$ layer 605 are separated from substrate 601 (FIG. 7E).

Figure 7F:
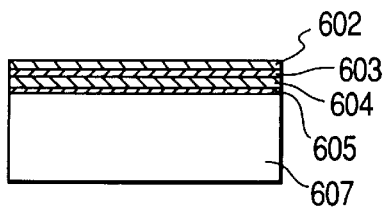
Figure 7F:
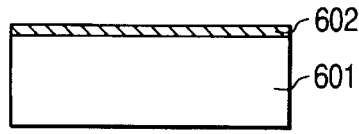

After separation of porous ion implantation layer 602/nonporous layer 603/nonporous thin film 604/$SiO_2$ layer 605 from thin film 606, second substrate 607 is bonded to the surface of $SiO_2$ 605 as shown in FIGS. 7FA and 7FB. Thereafter, porous ion implantation layer 602 is selectively removed.

Figure 7G:
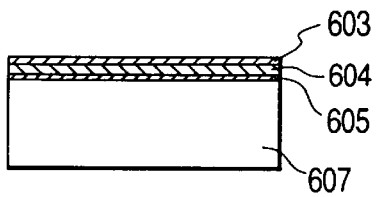
Figure 7G:
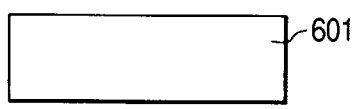

FIGS. 7GA and 7GB show the semiconductor substrates obtained according to this embodiment. On second substrate 607, the nonporous thin films such as thin single crystal Si films 603/604 are formed flat in thin layers in a large area over the entire wafer. By use of an insulating substrate as second substrate 607, the semiconductor substrate thus prepared is useful for production of insulation-separated electronic elements.

First single crystal Si substrate 601 can be reused repeatedly as the first silicon single crystal substrate or the second substrate after the remaining porous ion implantation layer is removed therefrom.

Embodiment 8

The process in this embodiment comprises steps of forming a nonporous layer at least on a main face of a first substrate, forming a porous layer in the interior of the first substrate with the surface kept nonporous, bonding a thin film onto the surface of the nonporous layer, separating the first substrate side and the film side at the porous layer, transferring the multilayer structure of the film side onto a supporting member, bonding the surface side of the insulation layer of the transferred multilayer structure to a second substrate, and removing the porous layer of the multilayer structure. The process is explained by reference to FIGS. 8A to 8GB.

Figure 8A:
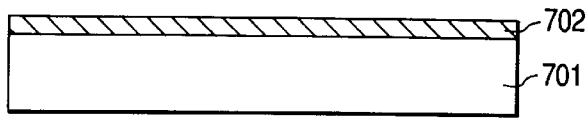
FIGS. 8A, 8B, 8C, 8D, 8E, 8FA, 8FB, 8GA, and 8GB are schematic sectional views for explaining still another embodiment of the present invention.
Figure 8B:
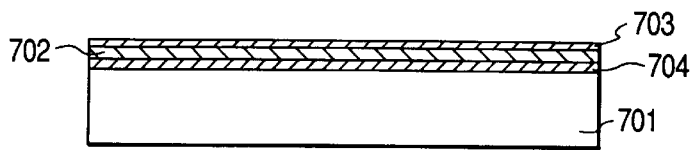

At least one nonporous layer 702 is formed on a main face of a first single crystal Si substrate 701 (FIG. 8A). $SiO_2$ 703 is preferably formed as the outermost layer to displace the bonding interface from the active layer. A porous ion implantation layer 704 is formed in the interior of first substrate 701 by implanting ions of at least one element of rare gases, hydrogen, and nitrogen from the surface layer side of the first substrate with nonporous layer 702 kept on the surface (FIG. 8B). Prior to the ion implantation, a protection film 704 such as a $SiO_2$ film is preferably formed on the main surface layer to prevent roughening of the surface. The porous ion implantation layer 704 is preferably formed at around the interface between first single crystal Si substrate 701 and nonporous layer 702 or inside nonporous layer 702.

Figure 8C:
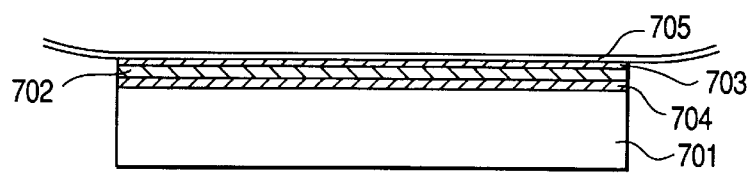
Figure 8D:
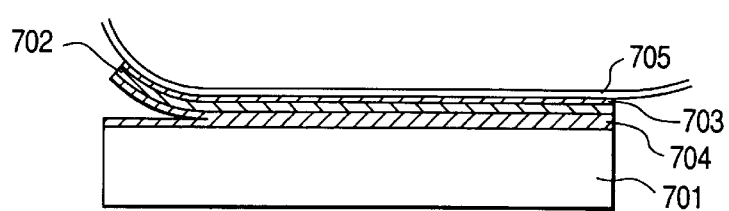
Figure 8E:
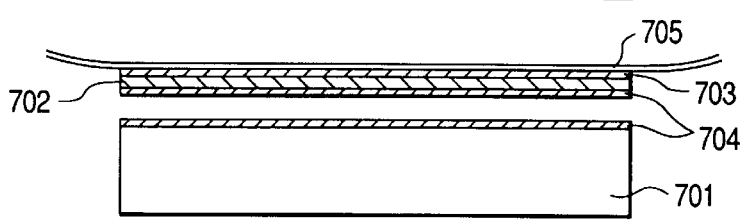

Onto the surface of the nonporous layer, flexible adherent film 705 or a flexible film with an adhesive is bonded (FIG. 8C). Thereafter, flexible film 705 is peeled from first single crystal Si substrate 701 (FIG. 8D) to separate the first substrate side and the thin film side at porous ion implantation layer 704. Thus, porous ion implantation layer 704/ nonporous layer 702/$SiO_2$ layer 703 are separated from substrate 701 (FIG. 8E).

Figure 8F:
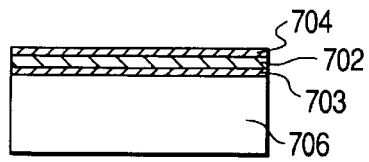
Figure 8F:
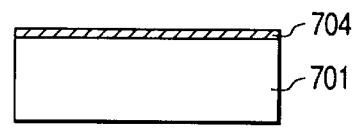

After separation of porous ion implantation layer 704/ nonporous layer 702/$SiO_2$ layer 703 from thin film 705, second substrate 706 is bonded to the surface of $SiO_2$ 703 as shown in FIG. 8FA. Then, porous ion implantation layer 704 is selectively removed.

Figure 8G:
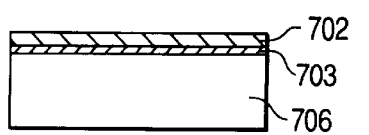
Figure 8G:

FIG. 8GA shows the semiconductor substrate obtained according to this embodiment. On second substrate 706, the nonporous thin film such as thin single crystal Si films 702 is formed flat and uniformly in a thin layer in a large area over the entire wafer. By use of an insulating substrate as second substrate 706, the semiconductor substrate thus prepared is useful for production of insulation-separated electronic elements.

First single crystal Si substrate 701 can be reused repeatedly as the first substrate or the second substrate after the remaining porous ion implantation layer is removed therefrom.

Embodiment 9

The processes of the above Embodiments can be practiced on both faces of the single crystal Si substrate to produce simultaneously two semiconductor substrates. FIGS. 9A to 9DC show, as an example, a two-face process based on the process of the above Embodiment 5. This two-face process can be applied to any of the above Embodiments. In FIGS. 9A to 9DC, the numeral 801 denotes a first single crystal Si substrate; 802 and 803, porous Si layers; 804 and 805, nonporous layers; 806 and 807, $SiO_2$; 808 and 809, flexible films; and 810 and 811, second substrates (supporting substrate).

First single crystal Si substrate 801 can be reused repeatedly as the first single crystal Si substrate or the second substrate after the remaining porous Si layer is removed therefrom. If the surface of single crystal Si substrate becomes unacceptably, rough the surface is smoothed out before reuse as the first or second substrate.

The supporting substrates 810, 811 need not be the same material, the thickness, and so forth. The nonporous thin film 804, 805 need not be the same material, thickness, and so forth.

Embodiment 10

A process for producing a solar cell according to present invention is described. This process comprises steps below:
(a) a step of forming porous layer on at least one main face of a substrate by anodization,
(b) a step of forming a semiconductor layer on the porous layer,
(c) a step of bonding a film onto the surface of the semiconductor layer, and
(d) a step of separating the substrate side and the film side at the porous layer and transferring the semiconductor layer onto the film.

The film used for the solar cell has preferably a low heat resistance of not higher than 400° C.

Figure 11:
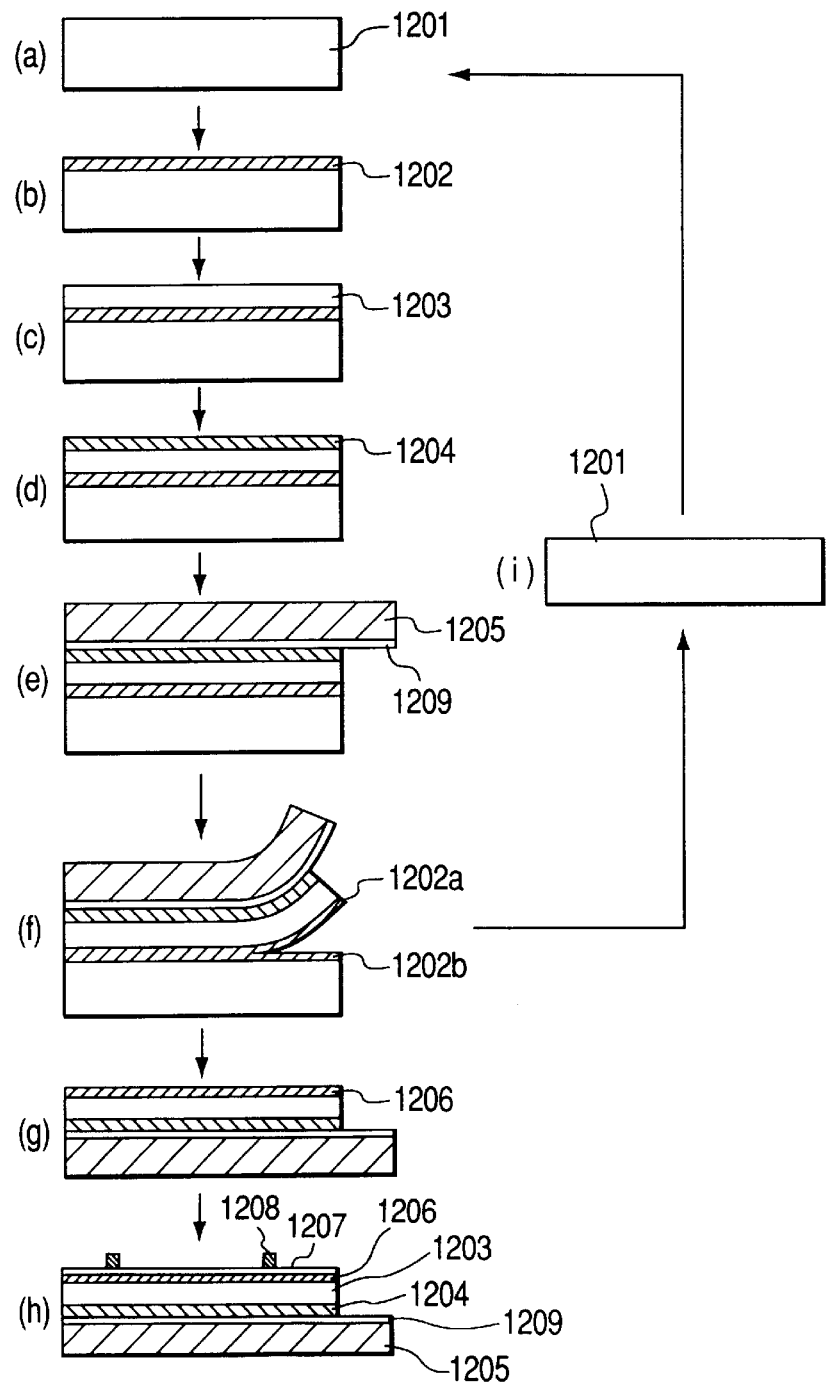
FIG. 11 is a drawing for explaining a process for producing a solar cell according to the process of the present invention.

Firstly, B (boron) is introduced by thermal diffusion into a surface layer of single crystal silicon substrate 1201 ((a) in FIG. 11). Single crystal substrate 1201 having the surface layer of $p^+$ is made porous by anodization in an HF solution, for example, such that the electric current level is kept low from the start for a certain time and then the current level is raised rapidly to complete the anodization in a short time ((b) in FIG. 11). The thermal diffusion of B is not essential, the anodization being practicable without the thermal diffusion of B (boron). The separation of the two sides at the porous layer can be facilitated by controlling the current level, in the anodization for the porosity, from an initial low level to a higher level to vary the density of the formed porous layer structure.

Onto surface layer 1202 having been made porous, silicon layer 1203 is formed by thermal CVD in a thickness necessary and sufficient as an active layer of a solar cell ((c) in FIG. 11). In the formation of silicon layer 1203, a extremely small amount of dopant may be added to control the active layer to be in a $p^+$ type (or an $n^-$ type).

On active layer 1203, $p^+$ layer (or $n^+$ layer) 1204 is formed by deposition by plasma CVD, or by increase of the amount of the dopant at the end of the formation of the above active layer 1203 ((d) in FIG. 11).

Separately, back electrode 1209 is printed with a copper paste on high polymer film substrate 1205. This polymer film substrate 1205 is brought into close contact with single crystal silicon substrate 1201 on the side of active layer 1203. The combined matter is heated in an oven (not shown in the drawing) to bond high polymer film substrate 1205 to single crystal silicon substrate 1201 ((e) in FIG. 11).

A force is applied to separate high polymer substrate 1205 and single crystal silicon substrate 1201. The two substrates are gradually separated by peeling from the edge of single crystal silicon substrate 1201 by utilizing the flexibility of the high polymer film to separate at the portion of porous layer 1202 ((f) in FIG. 11).

Porous layer 1202a remaining on active layer 1203 separated from the single crystal silicon substrate is removed selectively.

Figure 10:
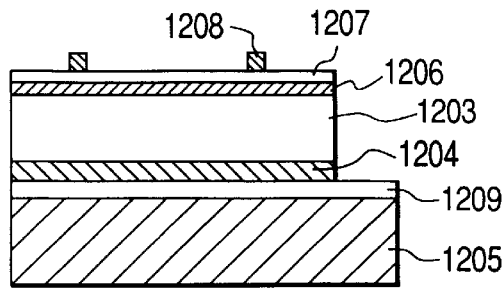
FIG. 10 is a schematic sectional view showing a structure of a solar cell prepared by employing the process of semiconductor article of the present invention.

On the surface of active layer 1203 after removal of the porous layer, $n^+$layer (or $p^+$ layer) 1206 is formed by plasma CVD or a like method ((g) in FIG. 11). Further thereon, light-transmissive electroconductive layer (ITO) 1207 serving also as a surface reflection prevention layer, and grid type collector electrode 1208 are vacuum-deposited to complete a solar cell ((h) in FIG. 11). FIG. 10 shows a solar cell prepared in such a manner.

Single crystal Si substrate 1201 can be reused repeatedly in the step of (a) in FIG. 11 after remaining porous Si layer 1202b is removed therefrom in the same manner as in the embodiments described previously ((i) in FIG. 11). If the surface of single crystal Si substrate 101 becomes unacceptably rough, the surface is smoothed out before reuse.

Embodiment 11

In another process, a polycrystal solar cell is prepared in the same manner as in Embodiment 10 except that single crystal silicon substrate 1201 in Embodiment 10 is replaced by a polycrystal silicon substrate and polycrystal silicon layer 1203 is formed.

Embodiment 12

A compound semiconductor solar cell is prepared as below.

Figure 12:
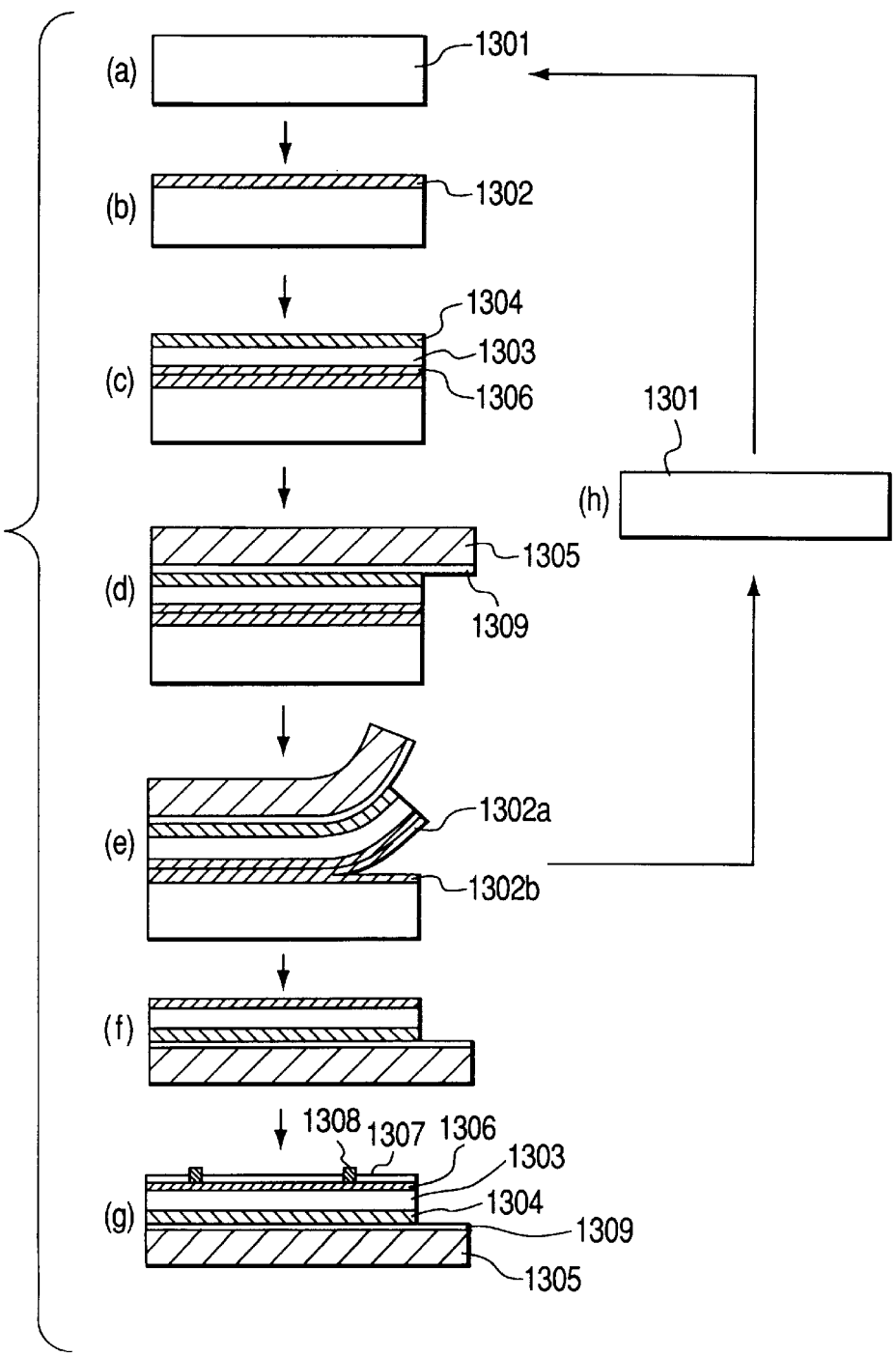
FIG. 12 is a drawing for explaining another process for producing a solar cell according to the process of the present invention.

Firstly, B (boron) is introduced by thermal diffusion into a surface layer of single crystal silicon substrate 1301 ((a) in FIG. 12). Single crystal substrate 1201 having the surface layer of $p^+$ is made porous by anodization in a HF solution, for example, such that the electric current level is kept low from the start for a certain time and then the current level is raised gradually to a higher level to complete the anodization ((b) in FIG. 12).

Onto surface layer 1302 having been made porous, $n^+$ layer (or $p^+$ layer) 1306, active layer of $n^-$ type (or $p^-$ type) 1303, $p^+$ layer (or $n^+$ layer) 1304 are successively formed by MOCVD ((c) in FIG. 12).

Separately, back electrode 1309 is printed with a copper paste onto high polymer film substrate 1305. This polymer film substrate 1305 is brought into close contact with compound semiconductor crystal silicon substrate 1301 on the side of compound semiconductor layer 1303. This combined matter is heated in an oven (not shown in the drawing) to fix high polymer film substrate 1305 to single crystal silicon substrate 1301 ((d) in FIG. 12).

A force is applied to separate high polymer substrate 1305 and single crystal silicon substrate 1301. The two substrates are gradually separated by peeling from the edge of single crystal silicon substrate 1301 by utilizing the flexibility of the high polymer film to separate at the portion of porous layer 1302 ((e) in FIG. 12).

Porous layer 1302a remaining on compound semiconductor layer 1303 separated from the single crystal silicon substrate is removed selectively by an etching solution which etches silicon at a higher rate than the compound semiconductor (FIG. 12 (f)).

On the surface of compound semiconductor layer 1303 after removal of the porous layer, grid type collector electrode 1308 and surface reflection prevention layer 1307 are vacuum-deposited to complete a solar cell ((g) in FIG. 12).

Single crystal Si substrate 1301 can be reused repeatedly in the step of (a) in FIG. 12 after remaining porous layer 1302b is removed therefrom in the same manner as in the embodiments described previously ((h) in FIG. 12). If the surface of single crystal Si substrate 101 becomes unacceptably rough, the surface is smoothed out before reuse.

In production of a solar cell by the process of the present invention, the substrate and the thin crystal semiconductor layer is suitably bonded by interposition of an electroconductive metal paste such as copper paste and silver paste, and firing it for fixation. The metal such as copper or silver after the firing serves also as the back electrode and a back reflection layer. A high polymer film, when used as the substrate, bonding is conducted by bringing the substrate and the thin crystal semiconductor layer (having the back electrode on the surface) together into close contact and heating it to a temperature above the softening point of the substrate film.

In the solar cell of the present invention, the surface of the semiconductor layer may be treated for texture pattern formation for the purpose of decreasing reflection loss of the introduced light. For the silicon, this treatment is conducted with hydrazine, NaOH, KOH, or the like. The height of the pyramids of the formed texture is preferably in the range of from several to several ten microns.

In the following the present invention will be clarified further by examples thereof, but it is to be understood that the present invention is by no means limited by these examples.

EXAMPLE 1

The surface layer of a monocrystalline Si wafer substrate was anodized in HF solution, under the following conditions:

current density: 7 (mA/cm$^2$)

anodizing bath: HF:H$_2$O:C$_2$H$_5$OH=1:1:1 time: 11 minutes porous Si thickness: 12 $\mu$m

Then an adhesive film (peeling tape No. 3200A supplied by Nitto Denko Co., Ltd.) was applied to the surface of the resulting porous layer, and then the rear face of the substrate was fixed by a vacuum chuck. Next, the adhesive film was then peeled off from the wafer. As a result, the porous Si layer was separated and left on the adhesive film. Such a porous Si layer is applicable to a light emitting device.

Also the porous Si remaining on the substrate was then removed by selective etching with a mixture of 49% hydrofluoric acid and 30% hydrogen peroxide under agitation. After surface treatment such as hydrogen annealing or surface polishing, the wafer could then be used as the first substrate in the process.

EXAMPLE 2

The surface layer of a monocrystalline Si wafer substrate was anodized in HF solution, under the following conditions:

current density: 7 (mA/cm$^2$)

anodizing bath: HF:H$_2$O:C$_2$H$_5$OH=1:1:1 time: 11 minutes porous Si thickness: 12 $\mu$m

Then the substrate was oxidized for 1 hour at 400° C. in oxygen atmosphere, whereby the internal wall of pores in the resulting porous Si layer was covered with a thermal oxidation film. Then, on the porous Si, monocrystalline Si was epitaxially grown, with a thickness of 0.15 $\mu$m, by CVD (chemical vapor deposition) under the following conditions:

source gas: SiH$_2$Cl$_2$/H$_2$ gas flow rate: 0.5/180 l/min.

gas pressure: 80 Torr temperature: 950° C.

growth rate: 0.3 $\mu$m/min.

Then an adhesive film (peeling tape No. BT-315 supplied by Nitto Denko Co., Ltd.) was applied to the surface of the monocrystalline Si, then the rear face of the substrate was fixed to a vacuum chuck, and the adhesive film was then peeled off from the wafer. As a result, the porous Si layer was split, and the epitaxial layer and the porous Si layer were left on the adhesive film.

Then the porous Si remaining on the film was selectively etched with a mixture of 49% hydrofluoric acid and 30% hydrogen peroxide under agitation. As a result, the monocrystalline Si was not etched but maintained, the porous Si could be completely removed by selective etching, utilizing the monocrystalline Si as an etch stopping material.

The etching rate of the non-porous monocrystalline Si is extremely low in the above-mentioned etching liquid, showing a selectivity as high as 10$^5$ in comparison with the etching rate for the porous layer, so that the etch amount in the non-porous layer remained within a practically negligible film thickness loss (in the order of tens of Angstroms).

It was confirmed, in the cross-sectional observation under a transmission electron microscope, that the Si layer did not show an introduction of new crystalline defects and maintained satisfactory crystallinity.

Also the porous Si remaining on the substrate was then removed by selective etching with a mixture of 49% hydrofluoric acid and 30% hydrogen peroxide under agitation. After surface processing such as hydrogen annealing or surface polishing, the wafer could then be used as the first substrate in the process.

EXAMPLE 3

The surface layer of a monocrystalline Si wafer substrate was anodized in HF solution, under the following conditions:

current density: 7 (mA/cm$^2$)
anodizing bath: HF:H$_2$O:C$_2$H$_5$OH=1:1:1
time: 4 minutes
porous Si thickness: 4.5 μm followed by:
current density: 30 (mA/cm$^2$)
anodizing bath: HF:H$_2$O:C$_2$H$_5$OH=1:1:1
time: 1 minute
porous Si thickness: about 4 μm Under these conditions, there was formed a porous Si layer with two-layer structure of different porosities. In this anodizing with the current density of 30 mA/cm$^2$, there was formed a structurally fragile porous Si layer with larger porosity.

Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.15 μm, by CVD (chemical vapor deposition) under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then an adhesive film (peeling tape No. 31RH supplied by Nitto Denko Co., Ltd.) was applied to the surface of the monocrystalline Si, then the rear face of the substrate was fixed to a vacuum chuck, and the adhesive film was then peeled off from the wafer. As a result, the wafer was split on the fragile porous Si layer of higher porosity as the boundary, and the epitaxial layer and the porous Si layer were separated from the wafer and were left on the adhesive film.

Then the porous Si remaining on the film was selectively etched with a mixture of 49% hydrofluoric acid and 30% hydrogen peroxide under agitation. As the monocrystalline Si was not etched, the porous Si could be completely removed by selective etching, utilizing the monocrystalline Si as the etch stopping material.

It was confirmed, in the cross-sectional observation under a transmission electron microscope, that the Si layer did not show an introduction of new crystalline defects and maintained satisfactory crystallinity.

Also the porous Si remaining on the first substrate was then removed by selective etching with a mixture of 49% hydrofluoric acid and 30% hydrogen peroxide under agitation. After hydrogen annealing, the wafer could then be used as the first substrate in the process.

EXAMPLE 4

In the surface layer of a monocrystalline Si substrate with an unspecified resistivity, a high concentration P$^+$ layer of a thickness of 5 μm, constituting the high concentration impurity layer, was formed by a diffusion process. At the same time a high concentration P$^+$ layer was formed also on the back surface. Then anodizing was conducted in HF solution from the top surface side of the high concentration layer, under the following conditions:

current density: 7 (mA/cm$^2$)
anodizing bath: HF:H$_2$O:C$_2$H$_5$OH=1:1:1
time: 11 minutes
porous Si thickness: 12 μm The resulting porous Si layer had a two-layer structure, with the lower porous Si having a finer and fragile structure in comparison with the surface layer part.

Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.15 μm, by CVD (chemical vapor deposition) under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then an adhesive film same as in Example 3 was applied to the surface and the adhesive film was then peeled off from the wafer.

As a result, the wafer was split on the lower fragile porous Si layer as the boundary, and the epitaxial layer and the porous Si layer were separated from the wafer and left on the adhesive film.

Then the porous Si remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

It was confirmed, in the cross-sectional observation under a transmission electron microscope, that the Si layer did not show an introduction of new crystalline defects and maintained satisfactory crystallinity.

Also the porous Si remaining on the first substrate was then removed by selective etching with a mixture of 49% hydrofluoric acid and 30% hydrogen peroxide under agitation. After surface treatment such as hydrogen annealing or surface polishing, the wafer could then be used as the first substrate into the diffusion process of the high concentration P$^+$ layer.

EXAMPLE 5

H$^+$ ion implantation was conducted on the surface of a monocrystalline Si substrate, at 40 keV and with a concentration of 5×10$^{16}$ ions/cm$^2$. The monocrystalline structure was maintained for about 0.2 μm from the surface. For the purpose of avoiding surface roughness resulting from the ion implantation, a SiO$_2$ layer is preferably formed on the surface in advance.

Then an adhesive film same as in Example 1 was applied to the surface of the Si substrate and the adhesive film was then peeled off from the wafer as in Example 1.

As a result, the wafer was split with the boundary at the ion implantation layer, and the $SiO_2$ layer and the monocrystalline Si layer were left on the adhesive film.

Then the ion implantation layer remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first substrate into the process.

EXAMPLE 6

$H^+$ ion implantation was conducted on the surface of a monocrystalline Si substrate, at 20 keV and with a concentration of $5 \times 10^{16}$ ion/cm$^2$. The monocrystalline structure was maintained for about 0.1 μm from the surface. For the purpose of avoiding surface roughness resulting from the ion implantation, a $SiO_2$ layer is preferably formed on the surface in advance.

After the peeling of the surfacial protective $SiO_2$ layer, a monocrystalline Si was epitaxially grown, with a thickness of 0.3 μm, by CVD (chemical vapor deposition) on the monocrystalline Si, under the following conditions:

source gas: $SiH_2Cl_2/H_2$ gas flow rate: 0.5/180 l/min.

gas pressure: 80 Torr temperature: 950° C.

growth rate: 0.3 μm/min.

Then an adhesive film same as in Example 1 was applied to the surface and the adhesive film was then peeled off from the wafer as in Example 1.

As a result, the wafer was split on the ion implantation layer as the boundary, and the monocrystalline Si layer and the ion implantation layer were left on the adhesive film.

Then the ion implantation layer on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first substrate into the process.

EXAMPLE 7

On a first monocrystalline Si substrate, a monocrystalline Si layer was epitaxially grown with a thickness of 0.3 μm by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 μm/min.

Then $H^+$ ion implantation was conducted on the surface of the epitaxial Si layer, at 40 keV and with a concentration of $5 \times 10^{16}$ ion/cm$^2$. The monocrystalline structure was maintained for about 0.2 μm from the surface. For the purpose of avoiding surface roughness resulting from the ion implantation, a $SiO_2$ layer is preferably formed on the surface in advance.

Then an adhesive film the same as in Example 2 was applied to the surface and the adhesive film was then peeled off from the wafer as in Example 2.

As a result, the wafer was split on the ion implantation layer as the boundary, and the $SiO_2$ layer, the monocrystalline Si layer and the ion implantation layer were left on the adhesive film.

Then the ion implantation layer on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first substrate into the process.

EXAMPLE 8

The surface layer of a first monocrystalline Si wafer substrate was anodized in HF solution, under the following conditions:

current density: 7 (mA/cm$^2$)

anodizing bath: $HF:H_2O:C_2H_5OH=1:1:1$ time: 11 minutes porous Si thickness: 12 μm Then the substrate was oxidized for 1 hour at 400° C. in an oxygen atmosphere, whereby the internal wall of the pores in the porous Si layer was covered with a thermal oxidation film. Then, on the porous Si, a monocrystalline Si was epitaxially grown, with a thickness of 0.15 μm, by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 μm/min.

Then, on the surface of the epitaxial Si layer, a $SiO_2$ layer of a thickness of 100 nm was formed by thermal oxidation.

Then an adhesive film the same as in Example 2 was applied to the surface and the adhesive film was then peeled off from the wafer as in Example 2.

As a result, the wafer was split on the porous Si layer as the boundary, and the $SiO_2$ layer, the epitaxial layer and the porous Si layer were left on the adhesive film.

Then, after the porous layer on the rear film surface was adhered to an acrylic substrate with an epoxy adhesive material, the film was etched off. Then the exposed surface of the $SiO_2$ layer was adhered to the surface of a separately prepared Si substrate (second substrate). As the $SiO_2$ surface and the surface of the Si substrate were extremely flat, strong adhesion was obtained merely by pressurizing at room temperature.

This example employed an acrylic substrate as the support member, but it is also possible to employ a film of which adhesive force is weakened by ultraviolet irradiation (such as supplied by Nitto Denko Co., Ltd.), thus utilizing the initially high adhesive force at the peeling the single- or multi-layered structure from the first substrate and, at the transfer to another support member, weakening the adhesive force by ultraviolet irradiation thereby peeling the film from the structure.

It is also possible, even without utilizing another support member, to adhere the surface side of the non-porous layer of the multi-layered structure to the second substrate by dissolving the thin film in etching liquid or peeling the film, of which adhesive force is weakened by ultraviolet irradiation as explained above, in liquid after weakening the adhesive force by ultraviolet irradiation, then scooping the remaining multi-layered structure with a mesh or a net and placing it on the second substrate.

Subsequently, after removing the acrylic substrate remaining on the second substrate by abrading the porous Si layer, the porous Si layer was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

In this manner a monocrystalline Si layer of a thickness of 0.1 $\mu$m was formed on the Si oxide film. The thickness of thus formed monocrystalline Si layer, measured in 100 points on the entire wafer, was uniform within a range of 101±3 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 $\mu$m, which was comparable to that of the commercially available wafer.

It was confirmed, in the cross-sectional observation under a transmission electron microscope, that the Si layer did not show an introduction of new crystalline defects and maintained satisfactory crystallinity.

The oxide film could be formed, instead of the surface of the epitaxial layer, on the surface of the second substrate or on both surfaces, with the equivalent results.

Also the porous Si layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate in the process.

EXAMPLE 9

The surface layer of a first monocrystalline Si wafer substrate was anodized in HF solution, under the following conditions:

current density: 7 ($mA/cm^2$)
anodizing bath: $HF:H_2O:C_2H_5OH=1:1:1$
time: 4 minutes
porous Si thickness: 4.5 $\mu$m followed by:
current density: 30 ($mA/cm^2$)
anodizing bath: $HF:H_2O:C_{2H5}OH=1:1:1$
time: 1 minute
porous Si thickness: about 4 $\mu$m In this anodizing with the current density of 30 $mA/cm^2$, there was formed a structurally fragile porous Si layer with larger porosity.

Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.3 $\mu$m, by CVD (chemical vapor deposition) under the following conditions:

source gas: $SiH_2Cl_2/H_2$
gas flow rate: 0.5/180 l/min.
gas pressure: 80 Torr
temperature: 950° C.
growth rate: 0.3 $\mu$m/min.

Then a $SiO_2$ layer of a thickness of 200 nm was formed by thermal oxidation on the surface of the epitaxial Si layer.

Then an adhesive film the same as in Example 8 was applied to the $SiO_2$ surface and then the film was peeled off.

As a result, the wafer was split on the lower fragile porous Si layer as the boundary, and the $SiO_2$ layer, the epitaxial layer and the porous Si layer were left on the adhesive film.

The subsequent processes were conducted in the same manner as in Example 8.

In this manner a monocrystalline Si layer of a thickness of 0.2 $\mu$m was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in a hydrogen atmosphere. The surface roughness, evaluated by an atomic force microscope, was about 0.2 nm presented by the mean square roughness in a square area of 5 $\mu$m, which was comparable to that of the commercially available Si wafer.

It was confirmed, in the cross-sectional observation under a transmission electron microscope, that the Si layer did not show an introduction of new crystalline defects and maintained satisfactory crystallinity.

EXAMPLE 10

In the surface layer of a monocrystalline Si substrate with an unspecified resistivity, a high concentration $P^+$ layer of a thickness of 5 $\mu$m was formed by a diffusion process. At the same time a high concentration $P^+$ layer was formed also on the back surface. Then anodizing was conducted in HF solution from the top surface side of the high concentration layer, under the following conditions:

current density: 7 ($mA/cm^2$)
anodizing bath: $HF:H_2O:C_2H_5OH=1:1:1$
time: 11 minutes
porous Si thickness: 12 $\mu$m The resulting porous Si layer had a two-layer structure, with the lower porous Si having a finer and fragile structure in comparison with the surface layer part.

Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.3 $\mu$m, by CVD (chemical vapor deposition) under the following conditions:

source gas: $SiH_2Cl_2/H_2$
gas flow rate: 0.5/180 l/min.

gas pressure: 80 Torr temperature: 950° C.

growth rate: 0.3 μm/min.

Then a SiO$_2$ layer of a thickness of 200 nm was formed by thermal oxidation on the epitaxial Si layer.

Then an adhesive film was applied to the surface as in Example 8 and was peeled off from the wafer.

As a result, the wafer was split on the lower fragile porous Si layer as the boundary, and the SiO$_2$ layer, the epitaxial layer and the porous Si layer remained on the adhesive film.

The SOI substrate was prepared by the subsequent processes as in Example 8.

In this manner a monocrystalline Si layer of a thickness of 0.2 μm was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

Also the porous Si layer remaining on the first substrate was then removed by selective etching with a mixture of 49% hydrofluoric acid and 30% hydrogen peroxide under agitation. As a result, the monocrystalline Si was not etched but remained, the porous Si could be completely removed by selective etching, utilizing the monocrystalline Si as the etch stopping material. The wafer could then be used as the first or second substrate into the diffusion process of the high concentration P$^+$ layer.

EXAMPLE 11

H$^+$ ion implantation was conducted on the surface of a first monocrystalline Si substrate, at 40 keV and with a concentration of 5×10$^{16}$ ion/cm$^2$. The monocrystalline structure was maintained for about 0.2 μm from the surface. Then a thermal oxide film (SiO$_2$) was formed on the surface.

Then an adhesive film was applied to the SiO$_2$ surface as in Example 8 and was then peeled off from the wafer as in Example 8.

As a result, the wafer was split with the boundary at the ion implantation layer, and the SiO$_2$ layer, the monocrystalline Si layer and the ion implantation layer were left on the adhesive film.

The subsequent processes were conducted in the same manner as in Example 8.

In this manner a monocrystalline Si layer of a thickness of 0.2 μm was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

EXAMPLE 12

H$^+$ ion implantation was conducted on the surface of a first monocrystalline Si substrate, at 20 keV and with a concentration of 5×10$^{16}$ ion/cm$^2$. The monocrystalline structure was maintained for about 0.1 μm from the surface. For the purpose of avoiding surface roughness resulting from the ion implantation, a SiO$_2$ layer is preferably formed on the surface in advance.

After the peeling of the surficial protective SiO$_2$ layer, a monocrystalline Si was epitaxially grown, with a thickness of 0.3 μm, by CVD (chemical vapor deposition) on the monocrystalline Si, under the following conditions:

source gas: SiH$_2$Cl$_2$/H$_2$ gas flow rate: 0.5/180 l/min.

gas pressure: 80 Torr temperature: 950° C.

growth rate: 0.3 μm/min.

Then a SiO$_2$ layer of a thickness of 200 nm was formed by thermal oxidation on the surface of the epitaxial Si layer.

Then an adhesive film was applied to the surface in the same manner as in Example 8 and was then peeled off from the wafer as in Example 8.

As a result, the wafer was split on the ion implantation layer as the boundary, and the SiO$_2$ layer, the monocrystalline Si layer and the ion implantation layer were left on the adhesive film.

The subsequent processes were conducted in the same manner as in Example 8.

In this manner a monocrystalline Si layer of a thickness of 0.2 μm was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate in the process.

EXAMPLE 13

On a first monocrystalline Si substrate, a monocrystalline Si layer was epitaxially grown with a thickness of 0.3 μm by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 μm/min.

Then $H^+$ ion implantation was conducted on the surface of the epitaxial Si layer, at 40 keV and with a concentration of $5 \times 10^{16}$ ion/cm$^2$. The monocrystalline structure was maintained for about 0.2 μm from the surface. For the purpose of avoiding surface roughness resulting from the ion implantation, a $SiO_2$ layer is preferably formed on the surface in advance.

Then a $SiO_2$ of a thickness of 200 nm was formed by thermal oxidation on the surface of the epitaxial Si layer.

Then an adhesive film was applied to the $SiO_2$ surface in the same manner as in Example 8 and was then peeled off from the wafer as in Example 8.

As a result, the wafer was split on the ion implantation layer as the boundary, and the $SiO_2$ layer, the monocrystalline Si layer and the ion implantation layer were left on the adhesive film.

The subsequent processes were conducted in the same manner as in Example 8.

In this manner a monocrystalline Si layer of a thickness of 0.2 μm was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate in the process.

EXAMPLE 14

The surface layer of a first monocrystalline Si wafer substrate was anodized in HF solution, under the following conditions:

current density: 7 (mA/cm$^2$)

anodizing bath: $HF:H_2O:C_2H_5OH=1:1:1$ time: 11 minutes porous Si thickness: 12 μm Then the substrate was oxidized for 1 hour at 400° C. in oxygen atmosphere, whereby the internal wall of the pores in the porous Si layer was covered with a thermal oxidation film. Then, on the porous Si, a monocrystalline GaAs was epitaxially grown, with a thickness of 0.5 μm, by MOCVD (metal organic chemical vapor deposition) under the following conditions:

source gas: $TMG/AsH_3/H_2$ gas pressure: 80 Torr temperature: 700° C.

Then an adhesive film same as in Example 1 was applied to the surface, and was then peeled off from the wafer as in Example 1.

As a result, the wafer was split on the porous Si as the boundary, and the epitaxial layer and the porous Si layer were left on the adhesive film. Then the porous layer at the rear side of the film was adhered to an acrylic substrate with an epoxy adhesive material, and the film was removed by etching. The exposed surface of the epitaxial layer was adhered to the surface of a separately prepared Si substrate (second substrate). After the acrylic substrate was removed by polishing, the surface of the second substrate was etched with a mixture of ethylenediamine, pyrocatechol and was (17 ml:3 g:8 ml) at 110° C.

The monocrystalline GaAs was not etched, while the ion implantation layer and the remainder of the first Si substrate were completely removed by selective etching, utilizing the monocrystalline GaAs as the etch stopping material.

In this manner a monocrystalline GaAs layer of a thickness of 0.5 μm could be formed on the Si substrate. The thickness of thus formed monocrystalline GaAs layer, measured in 100 points on the entire wafer, was uniform within a range of 504±16 nm.

The surface roughness, evaluated by an atomic force microscope, was about 0.3 nm represented by the mean square roughness in a square area of 50 μm, which was comparable to that of the commercially available GaAs wafer.

It was confirmed, in the cross-sectional observation under a transmission electron microscope, that the GaAs layer did not show an introduction of new crystalline defects and maintained satisfactory crystallinity.

Similar results could be obtained in other compound semiconductor materials.

It is also possible to achieve adhesion to the second substrate across a $SiO_2$ layer.

Also the porous Si remaining on the first substrate was then removed by selective etching with a mixture of 49% hydrofluoric acid and 30% hydrogen peroxide under agitation. After surface treatment such as hydrogen annealing or surface polishing, the wafer could be used again as the first or second substrate in the process.

EXAMPLE 15

The surface layer of a first monocrystalline Si wafer substrate was anodized in HF solution, under the following conditions:

current density: 7 (mA/cm$^2$)

anodizing bath: $HF:H_2O:C_2H_5OH=1:1:1$ time: 11 minutes porous Si thickness: 12 μm Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.15 μm, by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 μm/min.

Then a $SiO_2$ layer of a thickness of 100 nm was formed by thermal oxidation on the epitaxial Si layer.

Then an adhesive film same as in Example 3 was applied to the $SiO_2$ surface, and was then peeled off from the wafer in the same manner.

As a result, the wafer was split on the porous Si as the boundary, and the $SiO_2$ layer, the epitaxial layer and the porous Si layer were left on the adhesive film. Then the porous Si remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

Thus, a monocrystalline Si layer of a thickness of 0.1 $\mu$m and an $SiO_2$ layer of a thickness of 0.1 $\mu$m could be formed on the film.

The above-mentioned multi-layered structure was peeled off from the film and was adhered to the surface of a separately prepared Si substrate (second substrate).

In this manner there could be formed a monocrystalline Si layer of a thickness of 0.1 $\mu$m on the Si oxide film.

The thickness of thus formed monocrystalline Si layer, measured in 100 points on the entire wafer, was uniform within a range of 101±3 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 $\mu$m, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

Also the porous Si remaining on the first substrate was then removed by selective etching with a mixture of 49% hydrofluoric acid and 30% hydrogen peroxide under agitation. After surface treatment such as hydrogen annealing or surface polishing, the wafer could then be used again as the first or second substrate in the process.

EXAMPLE 16

The surface layer of a first monocrystalline Si wafer substrate was anodized in HF solution, under the following conditions:

current density: 7 (mA/cm$^2$)

anodizing bath: $HF:H_2O:C_2H_5OH=1:1:1$ time: 11 minutes porous Si thickness: 12 $\mu$m Then the substrate was oxidized for 1 hour at 400° C. in oxygen atmosphere, whereby the internal wall of the pores in the porous Si layer was covered with a thermal oxidation film. Then, on the porous Si, a monocrystalline Si was epitaxially grown, with a thickness of 0.15 $\mu$m, by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 $\mu$m/min.

Then a $SiO_2$ layer of a thickness of 100 nm was formed by thermal oxidation on the surface of the epitaxial Si layer.

Then H$^+$ ion implantation was conducted from the surface of the $SiO_2$ layer, at 100 keV and with a concentration of $3 \times 10^{16}$ ion/cm$^2$, whereby the porosity of the anodized porous Si layer about within the projected stroke increased.

Then an adhesive film was applied to the surface in the same manner as in Example 3, and was then peeled off from the wafer as in Example 3.

In this manner the wafer was split on the porous Si of the higher porosity (about within the projected stroke) as the boundary and the $SiO_2$ layer, the epitaxial layer and the porous Si layer remained on the film. The subsequent steps were conducted in the same manner as in Example 8.

There was thus obtained a monocrystalline Si layer of a thickness of 0.1 $\mu$m on the Si oxide film. The thickness of thus formed monocrystalline Si layer, measured in 100 points on the entire wafer, was uniform within a range of 101±3 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 $\mu$m, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the epitaxial layer, or on both surfaces.

Also the porous Si remaining on the first substrate was then removed by selective etching with a mixture of 49% hydrofluoric acid and 30% hydrogen peroxide under agitation. After surface treatment such as hydrogen annealing or surface polishing, the wafer could then be used again as the first or second substrate in the process.

EXAMPLE 17

This example shows the preparation of a solar cell by transferring a monocrystalline silicon layer onto a polyimide film by the process shown in FIG. 11.

On the surface of a monocrystalline silicon wafer 500 $\mu$m thick, boron was thermally diffused at 1200° C. utilizing $BCl_3$ as the thermal diffusion source, to form a p$^+$ diffusion layer of about 3 $\mu$m ((a) in FIG. 11). Then anodizing was conducted in HF solution under the conditions shown in Table 1 to form a porous silicon layer on the wafer ((b) in FIG. 11). The anodizing was initiated with a low current density of 5 mA/cm$^2$ for 2.5 minutes, then the current was gradually increased and the anodizing was terminated when the current density reached 30 mA/cm$^2$ after 30 seconds.

TABLE 1

| anodizing bath | $HF:H_2O:C_2H_5OH = 1:1:1$ |
|---|---|
| current density | 5 → 30 mA/cm$^2$ |
| anodizing time | 2.5 min. → (30 sec.) → 0 sec. |

The surface of the porous silicon layer was then subjected to epitaxial growth under the conditions of Table 2 in an ordinary thermal CVD apparatus to bring the thickness of the monocrystalline silicon layer to 30 $\mu$m.

TABLE 2

| gas flow ratio | substrate temperature | pressure | growth time |
|---|---|---|---|
| SiH$_2$Cl$_2$/H$_2$ = 0.5/100 (1/min.) | 1050° C. | atmosphere | 30 min. |

In the course of growth, a small amount of B$_2$H$_6$ (a fraction to several ppm) was added to grow the silicon layer of p$^-$ layer, and, at the end phase of the growth, the amount of B$_2$H$_6$ was increased to several hundred ppm to obtain a p$^+$ layer ((c) and (d) in FIG. 11).

On a polyimide film of a thickness of 50 μm, copper paste was applied by screen printing with a thickness of 10 to 30 μm, and the surface thereof was maintained in close contact with and adhered to the p$^+$ silicon layer of the above-mentioned wafer.

In this state heat treatment was conducted for 20 minutes at 360° C. in an oven to sinter the copper paste and to fix the polyimide film and the wafer ((e) in FIG. 11).

The exposed face of the wafer fixed to the polyimide film was fixed by a vacuum chuck (not shown), and an end of the polyimide film was pulled to gradually peel the film from the wafer, utilizing the flexibility of the polyimide film. In this manner the silicon layer was peeled from the wafer and transferred onto the polyimide film ((f) in FIG. 11).

The porous layer remaining on the silicon layer peeled off from the silicon wafer was selectively etched with a mixture of hydrofluoric acid, hydrogen peroxide and deionized water, under agitation. The silicon layer remained without being etched, while the porous layer alone was completely removed.

The etching rate of the non-porous monocrystalline Si is extremely low in the above-mentioned etching liquid, showing a selectivity as high as 10$^5$ in comparison with the etching rate for the porous layer, so that the etched amount in the non-porous layer remained within a practically negligible film thickness loss (in the order of tens of Angstroms).

It was confirmed, in the cross-sectional observation under a transmission electron microscope, that the Si layer did not show an introduction of new crystalline defects and maintained satisfactory crystallinity.

The surface of the silicon layer obtained on the polyimide film was cleaned by etching with a hydrofluoric acid/nitric acid mixture, and, on the silicon layer, an n-type μc-Si layer was deposited with a thickness of 200 Å under the conditions shown in Table 3, in an ordinary plasma CVD apparatus ((g) in FIG. 11). The dark conductivity of the μc-Si layer was about 5 S (Siemens)/cm, Siemens being an inverse of ohms (Ω).

TABLE 3

| gas flow ratio | substrate temperature | pressure | discharge power |
|---|---|---|---|
| SiH$_4$/H$_2$ = 1 cc/20 cc PH$_3$/SiH$_4$ = 2.0 × 10$^{-3}$ | 250° C. | 0.5 Torr | 20 W |

Finally, on the μc-Si layer, there were formed: ITO transparent conductive film (82 nm)/current collecting electrode (Ti/Pd/Ag (400 nm/200 nm/1 μm)) by EB (electron beam) evaporation to obtain a solar cell ((h) in FIG. 11).

This thin film monocrystalline silicon solar cell on polyimide film was subjected to the measurement of the I-V characteristics under the irradiation with light of AM1.5 (100 mW/cm$^2$). With a cell area of 6 cm$^2$, there were obtained an open-circuit voltage of 0.6 V, a shortcircuit photocurrent of 35 mA/cm$^2$ and a fill factor of 0.79, with an energy conversion efficiency of 16.6%.

The porous layer remaining on the silicon wafer after peeling was also removed by etching in the above-explained manner, whereby a smooth surface was exposed ((i) in FIG. 11). The regenerated wafer thus obtained was subjected to the above-explained process repeatedly to obtain plural units of the thin film monocrystalline solar cell having a semiconductor layer of high quality.

EXAMPLE 18

This example shows the preparation of a solar cell by transferring a polycrystalline silicon layer onto a polyimide film by the process shown in FIG. 11.

On the surface of a cast silicon (polysilicon) wafer 1 mm thick, boron was thermally diffused at 1200° C. utilizing BCl$_3$ as the thermal diffusion source, to form a p$^+$ diffusion layer of about 3 μm ((a) in FIG. 11). Then anodizing was conducted in HF solution under the conditions shown in Table 4 to form a porous silicon layer on the wafer ((b) in FIG. 11). The anodizing was initiated with a low current density of 5 mA/cm$^2$ for 2.5 minutes, then the current was abruptly increased to 100 mA/cm$^2$ and the anodizing was terminated after 8 seconds.

TABLE 4

| anodizing bath | HF:H$_2$O:C$_2$H$_5$OH = 1:1:1 |
|---|---|
| current density | 5 → 100 mA/cm$^2$ |
| anodizing time | 2.5 min. → 8 sec. |

The surface of the porous silicon layer was then subjected to crystal growth under the conditions of Table 5 in an ordinary thermal CVD apparatus to bring the thickness of the monocrystalline silicon layer to 30 μm.

In the course of growth, a small amount of PH$_3$ (a fraction to several ppm) was added to grow the silicon layer of n$^-$ layer, and, at the end phase of the growth, the amount of PH$_3$ was increased to several hundred ppm to obtain an n$^+$ layer ((c) and (d) in FIG. 11).

TABLE 5

| gas flow ratio | substrate temperature | pressure | growth time |
|---|---|---|---|
| SiH$_4$/H$_2$ = 0.4/100 (1/min.) | 1050° C. | 100 Torr | 25 min. |

On a polyimide film of a thickness of 50 μm, copper paste was applied by screen printing with a thickness of 10 to 30 μm, and the surface thereof was maintained in close contact with and adhered to the n$^+$ silicon layer of the above-mentioned wafer.

In this state, heat treatment was conducted for 20 minutes at 360° C. in an oven to sinter the copper paste and to fix the polyimide film and the wafer ((e) in FIG. 11).

The exposed face of the wafer fixed to the polyimide film was fixed by a vacuum chuck (not shown), and an end of the polyimide film was pulled to gradually peel the film from the wafer, utilizing the flexibility of the polyimide film. In this manner the silicon layer was peeled from the wafer and transferred onto the polyimide film ((f) in FIG. 11).

The porous layer remaining on the silicon layer peeled off from the silicon wafer was selectively etched with a mixture of hydrofluoric acid, hydrogen peroxide and deionized water, under agitation. The silicon layer remained without being etched, while the porous layer alone was completely removed.

The etching rate of the non-porous monocrystalline Si is extremely low in the above-mentioned etching liquid, showing a selectivity as high as $10^5$ in comparison with the etching rate for the porous layer, so that the etched amount in the non-porous layer remained within a practically negligible film thickness loss (on the order of tens of Angstroms).

It was confirmed, in the cross-sectional observation under a transmission electron microscope, that the Si layer did not show an introduction of new crystalline defects and maintained satisfactory crystallinity.

The surface of the silicon layer obtained on the polyimide film was cleaned by etching with hydrofluoric acid/nitric acid mixture, and, on the silicon layer, a p-type μc-Si layer was deposited with a thickness of 200 Å under the conditions shown in Table 6, in an ordinary plasma CVD apparatus ((g) in FIG. 11). The dark conductivity of the μc-Si layer was about 1 S/cm.

TABLE 6

| gas flow ratio | substrate temperature | pressure | discharge power |
|---|---|---|---|
| $SiH_4/H_2$ = 1 cc/20 cc $B_2H_6/SiH_4$ = 2.0 × $10^{-3}$ | 250° C. | 0.5 Torr | 20 W |

Finally, on the μc-Si layer, there were formed: ITO transparent conductive film (82 nm)/current collecting electrode (Ti/Pd/Ag (400 nm/200 nm/1 pm)) by EB (electron beam) evaporation to obtain a solar cell ((h) in FIG. 11).

This thin film polycrystalline silicon solar cell on polyimide film was subjected to the measurement of the I–V characteristics under the irradiation with light of AM1.5 (100 mW/cm$^2$). With a cell area of 6 cm$^2$, there were obtained an open-circuit voltage of 0.58 V, a shortcircuit photocurrent of 33 mA/cm$^2$ and a fill factor of 0.78, with an energy conversion efficiency of 14.9%.

The porous layer remaining on the silicon wafer after peeling was also removed by etching in the above-explained manner, whereby a smooth surface was exposed ((i) in FIG. 11). The regenerated wafer thus obtained was subjected to the above-explained process repeatedly to obtain plural units of the thin film polycrystalline solar cell having a semiconductor layer of high quality.

EXAMPLE 19

This example shows the preparation of a solar cell by transferring a compound semiconductor layer onto a polyimide film.

On the surface of a monocrystalline silicon wafer 500 μm thick, boron was thermally diffused at 1200° C. utilizing $BCl_3$ as the thermal diffusion source, to form a p$^+$ diffusion layer of about 3 μm ((a) in FIG. 12). Then anodizing was conducted in HF solution under the conditions shown in Table 7 to form a porous silicon layer on the wafer ((b) in FIG. 12). The anodizing was initiated with a low current density of 5 mA/cm$^2$ for 2 and 2.5 minutes, then the current was gradually increased and the anodizing was terminated when the current density reached 40 mA/cm,$^2$ after 20 seconds.

TABLE 7

| anodizing bath | $HF:H_2O:C_2H_5OH$ = 1:1:1 |
|---|---|
| current density | 1 → 5 → 40 mA/cm$^2$ |
| anodizing time | 2 min. → 2.5 min. → (20 sec.) → 0 sec. |

Figure 13:
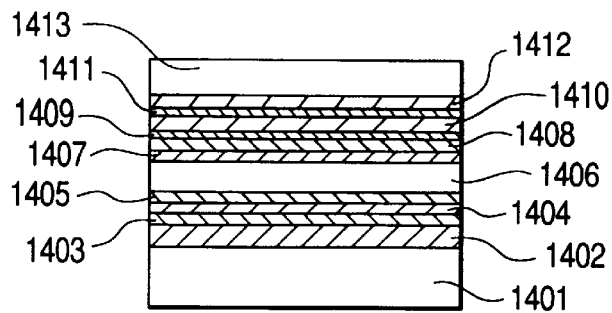
FIG. 13 is a schematic sectional view showing the structure of the GaAs/AlGaAs thin film solar cell formed on the porous layer produced by the process explained by FIG. 12.

The surface of the porous silicon layer was annealed for 7 minutes at 1050° C. in hydrogen atmosphere, and was then subjected to the deposition of GaAs/AlGaAs (monocrystalline) layer of tandem structure as shown in FIG. 12 ((c) in FIG. 12). The components 1306, 1303 and 1304 in FIG. 12 are replaced by 1403 to 1413 in FIG. 13, in which there are shown a crystalline substrate 1401; a porous layer 1402; n$^+$-GaAs 1403; n$^+$Al$_x$Ga$_{1-x}$As 1404; n-Al$_{0.37}$Ga$_{0.63}$As 1405; p-Al$_{0.37}$Ga$_{0.63}$As 1406; p$^+$-Al$_x$Ga$_{1-x}$ As 1407; p-Al$_{0.37}$Ga$_{0.63}$As 1408; n$^+$-Al$_x$Ga$_{1-x}$ As 1409; n--Al$_{0.37}$Ga$_{0.63}$As 1410; n$^+$-Al$_{0.9}$Ga$_{0.1}$As 1411; n-GaAs 1412; and p-GaAs 1413.

On the outermost surface of the grown p-GaAs layer, Pd/Au was formed by EV evaporation. Then, on a polyimide film of a thickness of 50 μm, copper paste was applied by screen printing with a thickness of 10 to 30 μm, and the surface thereof was maintained in close contact with and adhered to the GaAs/AlGaAs layer of the above-mentioned wafer.

In this state, heat treatment was conducted for 20 minutes at 370° C. in an oven to sinter the copper paste and to fix the polyimide film and the wafer ((d) in FIG. 12).

The exposed face of the wafer fixed to the polyimide film was fixed by a vacuum chuck (not shown), and an end of the polyimide film was pulled to gradually peel the film from the wafer, utilizing the flexibility of the polyimide film. In this manner the porous layer was broken to peel the GaAs/AlGaAs layer from the wafer and transfer it onto the polyimide film ((e) in FIG. 12).

The porous layer remaining on the silicon layer peeled off from the silicon wafer was selectively etched at 110° C. with a mixture of ethylenediamine, pyrocathecol and deionized water. The GaAs/AlGaAs layer remained without being etched, while the porous layer alone was completely removed ((f) in FIG. 12).

The etching rate of the monocrystalline GaAs is extremely low in the above-mentioned etching liquid, so that the etch amount in the non-porous layer remained within a practically negligible film thickness loss.

It was confirmed, in the cross-sectional observation under a transmission electron microscope, that the GaAs/AlGaAs layer did not show an introduction of new crystalline defects and maintained satisfactory crystallinity.

The outermost n$^+$-GaAs layer of the GaAs/AlGaAs layer obtained on the polyimide film was etched in a grid pattern to expose the n$^+$-Al$_x$Ga$_{1-x}$As layer, then a surface electrode (Au/Ge/Ni/Au) was formed solely on the grid-patterned n$^+$-GaAs layer by EB evaporation and photolithography, and a TiO$_2$/MgO antireflective film was deposited by plasma CVD to obtain a solar cell.

Thus obtained thin film monocrystalline GaAs/AlGaAs solar cell on polyimide film was subjected to the measurement of the I–V characteristics under the irradiation with light of AM1.5 (100 mW/cm$^2$). With a cell area of 4 cm$^2$, there were obtained an open-circuit voltage of 2.3 V, a shortcircuit photocurrent of 12.8 mA/cm$^2$ and a fill factor of 0.81, with an energy conversion efficiency of 23.8%.

The porous layer remaining on the silicon wafer after peeling was also removed by etching as in Examples 17 and 18, whereby a smooth surface was exposed ((h) in FIG. 12). The regenerated wafer thus obtained was subjected to the above-explained process repeatedly to obtain plural units of the thin film compound semiconductor solar cell having a semiconductor layer of high quality.

EXAMPLE 20

The surface layer of a first monocrystalline Si wafer substrate was anodized in HF solution, under the following conditions:

current density: 7 (mA/cm$^2$)
anodizing bath: HF:H$_2$O:C$_2$H$_5$OH=1:1:1
time: 11 minutes
porous Si thickness: 12 μm Then the substrate was oxidized for 1 hour at 400° C. in oxygen atmosphere, whereby the internal wall of the pores in the porous Si layer was covered with a thermal oxidation film. Then, on the porous Si, monocrystalline Si was epitaxially grown, with a thickness of 0.15 μm, by CVD (chemical vapor deposition) under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then, on the surface of the epitaxial Si layer, a SiO$_2$ layer of a thickness of 20 nm was formed by thermal oxidation. This oxide film is provided for protection for adhering the adhesive film.

Then an adhesive film was applied as in Example 1, and was then peeled off from the wafer.

As a result, the peeling took place at the porous Si layer, and the SiO$_2$ layer, the epitaxial layer and the porous Si layer were separated from the wafer and left on the adhesive film.

Then the porous Si remaining on the film was selectively etched with a mixture of 49% hydrofluoric acid and 30% hydrogen peroxide under agitation. As a result, the monocrystalline Si was not etched, the porous Si could be completely removed by selective etching, utilizing the monocrystalline Si as the etch stopping material.

The monocrystalline Si surface exposed by etching was adhered to the surface of an Si substrate bearing thereon an oxide film 200 nm thick.

After removal of the film by etching, a monocrystalline Si layer 0.1 μm thick was formed on the second substrate. The thickness of thus formed monocrystalline Si layer, measured in 100 points on the entire wafer, was uniform within a range of 101±3 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available wafer.

It was confirmed, in the cross-sectional observation under a transmission electron microscope, that the Si layer did not show an introduction of new crystalline defects and maintained satisfactory crystallinity.

Also the porous Si layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate in the process.

EXAMPLE 21

H$^+$ ion implantation was conducted on the surface of a first monocrystalline Si substrate, at 40 keV and with a concentration of 5×10$^{16}$ ions/cm$^2$. The monocrystalline structure was maintained for about 0.2 μm from the surface. For the purpose of avoiding surface roughness resulting from the ion implantation, a SiO$_2$ layer is preferably formed on the surface in advance.

Then an adhesive film was applied to the surface in the same manner as in Example 3, and was then peeled off from the wafer as in Example 3.

As a result, the wafer was split with the boundary at the ion implantation layer, and the SiO$_2$ layer, the monocrystalline Si layer and the ion implantation layer were left on the adhesive film.

Then the ion implantation layer remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

The monocrystalline Si surface exposed by etching was adhered to the surface of a separately prepared second substrate. Two kinds of the second substrate were employed; namely a Si substrate with a surfacial oxide film of a thickness of 200 nm, and a quartz substrate.

After removal of the film by peeling or etching, a monocrystalline Si layer of a thickness of 0.2 μm was formed on the second substrate. The thickness of thus formed monocrystalline Si layer, measured in 100 points on the entire wafer, was uniform within a range of 201±6 nm.

Then thermal treatment was conducted in hydrogen atmosphere for 1 hour at 1100° C. in case of the Si substrate, or for 4 hours at 900° C. in case of the quartz substrate. The surface roughness, evaluated by an atomic force microscope, was about 0.2 nm represented by the mean square roughness in a square area of 5 μm, which was comparable to that of the commercially available wafer.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate into the process.

EXAMPLE 22

H$^+$ ion implantation was conducted on the surface of a monocrystalline Si substrate, at 20 keV and with a concentration of 5×10$^{16}$ ion/cm$^2$. The monocrystalline structure was maintained for about 0.1 μm from the surface. For the purpose of avoiding surface roughness resulting from the ion implantation, a SiO$_2$ layer is preferably formed on the surface in advance.

After the peeling of the surfacial protective SiO$_2$ layer, a monocrystalline Si was epitaxially grown, with a thickness of 0.3 μm, by CVD (chemical vapor deposition) on the monocrystalline Si, under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then a SiO$_2$ layer of a thickness of 20 nm was formed by thermal oxidation on the surface of the epitaxial Si layer. This layer is formed as a protective layer for adhering the adhesive film.

Then an adhesive film was applied to the surface in the same manner as in Example 3 and was then peeled off from the wafer in a similar manner.

As a result, the wafer was split on the ion implantation layer as the boundary, and the $SiO_2$ layer, the monocrystalline Si layer and the ion implantation layer were left on the adhesive film.

Then the ion implantation layer remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

The monocrystalline Si surface exposed by etching was adhered to the surface of a separately prepared quartz substrate.

After removal of the film by etching, a monocrystalline Si layer of a thickness of 0.2 μm was formed on the second substrate. The thickness of thus formed monocrystalline Si layer, measured in 100 points on the entire wafer, was uniform within a range of 201±6 nm.

Then thermal treatment was conducted in hydrogen atmosphere for 4 hours at 900° C. The surface roughness, evaluated by an atomic force microscope, was about 0.2 nm represented by the mean square roughness in a square area of 5 μm, which was comparable to that of the commercially available wafer.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate into the process.

EXAMPLE 23

On a first monocrystalline Si substrate, a monocrystalline Si layer was epitaxially grown with a thickness of 0.3 μm by CVD (chemical vapor deposition) under the following conditions:

source gas: $SiH_2Cl_2/H_2$ gas flow rate: 0.5/180 l/min.

gas pressure: 80 Torr temperature: 950° C.

growth rate: 0.3 μm/min.

Then $H^+$ ion implantation was conducted on the surface of the epitaxial Si layer, at 40 keV and with a concentration of $5 \times 10^{16}$ ion/cm². The monocrystalline structure was maintained for about 0.2 μm from the surface. For the purpose of avoiding surface roughness resulting from the ion implantation, a $SiO_2$ layer is preferably formed on the surface in advance.

Then a $SiO_2$ layer 20 nm thick was formed by thermal oxidation on the surface of the epitaxial Si layer. This layer is formed as a protective layer for adhering the adhesive film.

Then an adhesive film was applied to the surface in the same manner as in Example 3 and was then peeled off from the wafer in the similar manner.

As a result, the wafer was split on the ion implantation layer as the boundary, and the $SiO_2$ layer, the monocrystalline Si layer and the ion implantation layer were left on the adhesive film.

The subsequent steps were conducted in the same manner as in Example 22.

The surface roughness of thus obtained substrate, evaluated by an atomic force microscope, was about 0.2 nm represented by the mean square roughness in a square area of 5 μm, which was comparable to that of the commercially available wafer.

It was confirmed, in the cross-sectional observation under a transmission electron microscope, that the Si layer did not show an introduction of new crystalline defects and maintained satisfactory crystallinity.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate into the process.

EXAMPLE 24

$H^+$ ion implantation was conducted on the surface of a first monocrystalline Si substrate, at 40 keV and with a concentration of $5 \times 10^{16}$ ion/cm². The monocrystalline structure was maintained for about 0.2 μm from the surface. For the purpose of avoiding surface roughness resulting from the ion implantation, a $SiO_2$ layer is preferably formed on the surface in advance.

Then an adhesive film was applied to the surface in the same manner as in Example 3 and was then peeled off from the wafer as in Example 3.

As a result, the wafer was split with the boundary at the ion implantation layer, and the $SiO_2$ layer, the monocrystalline Si layer and the ion implantation layer were left on the adhesive film.

Then the ion implantation layer remaining on the film was selectively etched with a mixture of 49% hydrofluoric acid and 30% hydrogen peroxide under agitation. As a result, the monocrystalline Si was not etched but remained, the porous Si could be completely removed by selective etching, utilizing the monocrystalline Si as an etch stopping material.

After the peeling of the adhesive film, the exposed $SiO_2$ surface was adhered to the surface of a separately prepared Si (second) substrate.

In this manner, a monocrystalline Si layer 0.2 μm thick was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

Similar results could be obtained by forming the oxide film on the surface of the second substrate instead of the surface of the first substrate, or on both surfaces.

Also the ion implantation layer remaining on the first substrate was then removed by selective etching with a mixture of 49% hydrofluoric acid and 30% hydrogen peroxide under agitation. After surface treatment such as hydrogen annealing or surface polishing, the wafer could then be used as the first or second substrate in the process.

EXAMPLE 25

H+ ion implantation was conducted on the surface of a monocrystalline Si substrate, at 20 keV and with a concentration of $5 \times 10^{16}$ ion/cm$^2$. The monocrystalline structure was maintained for about 0.1 μm from the surface. For the purpose of avoiding surface roughness resulting from the ion implantation, a SiO$_2$ layer is preferably formed on the surface in advance.

After the peeling of the surfacial protective SiO$_2$ layer, a monocrystalline Si was epitaxially grown, with a thickness of 0.3 μm, by CVD (chemical vapor deposition) on the monocrystalline Si, under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then a SiO$_2$ film of a thickness of 200 nm was formed by thermal oxidation on the surface of the epitaxial Si layer.

Then an adhesive film same as in Example 2 was applied to the surface and was then peeled off from the wafer as in Example 2.

As a result, the wafer was split on the ion implantation layer as the boundary, and the SiO$_2$ layer, the monocrystalline Si layer and the ion implantation layer were left on the adhesive film.

The subsequent steps were conducted in the same manner as in Example 24.

In this manner, a monocrystalline Si layer 0.2 μm thick was formed on the Si oxide film. The thickness of thus formed monocrystalline Si layer, measured in 100 points on the entire wafer, was uniform within a range of 201±6 nm.

It was confirmed, in the cross-sectional observation under a transmission electron microscope, that the Si layer did not show an introduction of new crystalline defects and maintained satisfactory crystallinity.

EXAMPLE 26

On a first monocrystalline Si substrate, a monocrystalline Si layer was epitaxially grown with a thickness of 0.3 μm by CVD (chemical vapor deposition) under the following conditions:

source gas: SiH$_2$Cl$_2$/H$_2$
gas flow rate: 0.5/180 l/min.
gas pressure: 80 Torr
temperature: 950° C.
growth rate: 0.3 μm/min.

Then H+ ion implantation was conducted on the surface of the epitaxial Si layer, at 40 keV and with a concentration of $5 \times 10^{16}$ ion/cm$^2$. The monocrystalline structure was maintained for about 0.2 μm from the surface. For the purpose of avoiding surface roughness resulting from the ion implantation, a SiO$_2$ layer is preferably formed on the surface in advance.

Then an SiO$_2$ layer 200 nm thick was formed by thermal oxidation on the surface of the epitaxial Si layer.

Then an adhesive film was applied to the surface in the same manner as in Example 2 and was then peeled off from the wafer in the similar manner.

As a result, the wafer was split on the ion implantation layer as the boundary, and the SiO$_2$ layer, the monocrystalline Si layer and the ion implantation layer were left on the adhesive film.

The subsequent steps were conducted in the same manner as in Example 24.

In this manner a monocrystalline Si layer 0.2 μm thick was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in a hydrogen atmosphere. The surface roughness, evaluated by an atomic force microscope, was about 0.2 nm represented by the mean square roughness in a square area of 5 μm, which was comparable to that of the commercially available Si wafer.

It was confirmed, in the cross-sectional observation under a transmission electron microscope, that the Si layer did not show an introduction of new crystalline defects and maintained satisfactory crystallinity.

EXAMPLE 27

Figure 14:
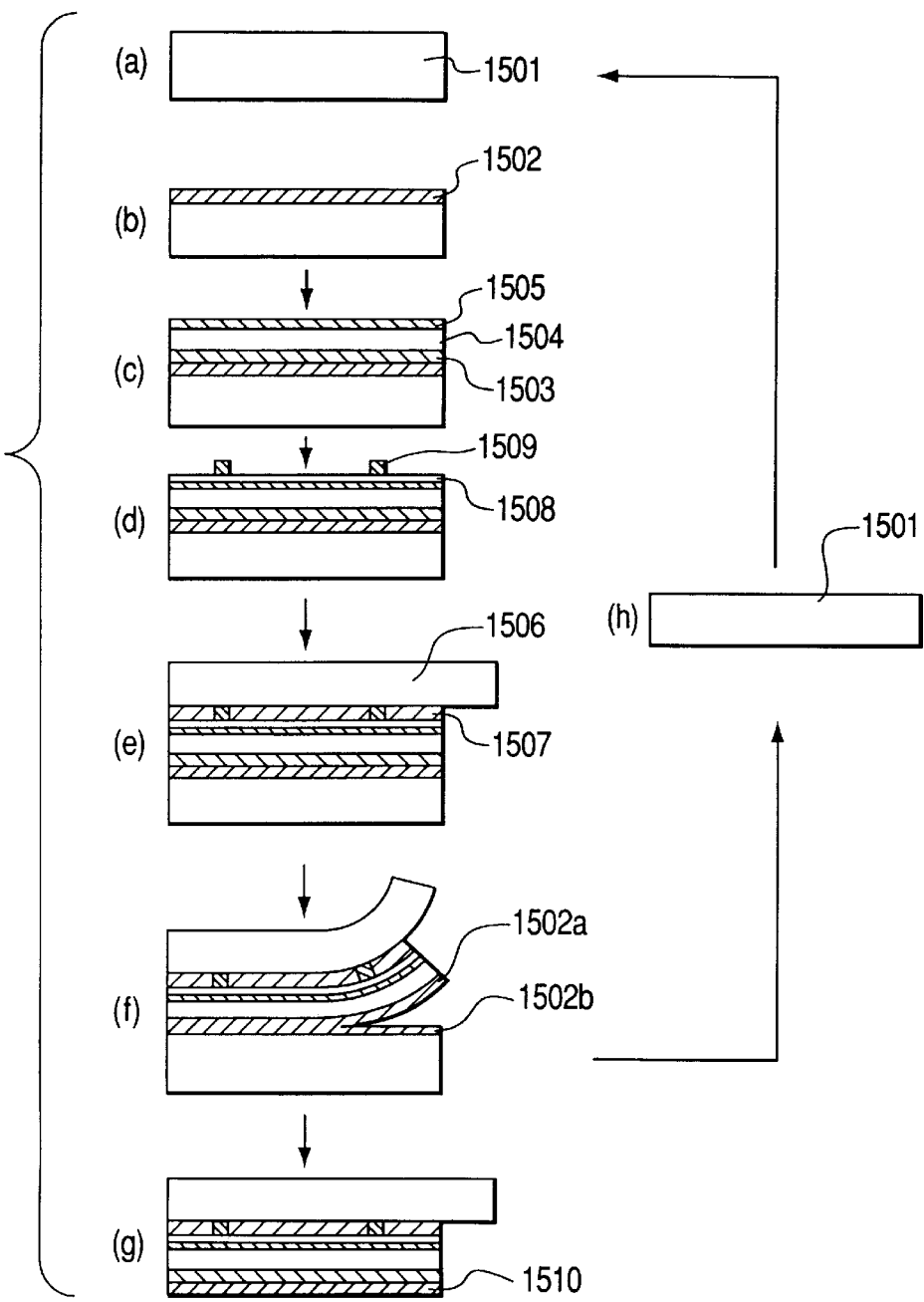
FIG. 14 is a drawing for explaining a process for producing a solar cell according to the process of the present invention.

This example shows the preparation of a solar cell by transferring a monocrystalline silicon layer onto a Tefzel® film (a transparent film produced by DuPont de Nemours) by the process shown in FIG. 14.

On the surface of a monocrystalline silicon wafer 500 μm thick, boron was thermally diffused at 1200° C. utilizing BCl$_3$ as the thermal diffusion source, to form a p+ diffusion layer of about 3 μm ((a) in FIG. 14). Then anodizing was conducted in HF solution under the conditions shown in Table 8 to form a porous silicon layer on the wafer ((b) in FIG. 14). The anodizing was initiated with a low current density of 5 mA/cm$^2$ for 2.5 minutes, then the current was gradually increased and the anodizing was terminated when the current density reached 30 mA/cm$^2$ after 30 seconds.

TABLE 8

| | |
|---|---|
| anodizing bath | HF:H$_2$O:C$_2$H$_5$OH = 1:1:1 |
| current density | 5 → 30 mA/cm$^2$ |
| anodizing time | 2.5 min. → (30 sec.) → 0 sec. |

The surface of the porous silicon layer was then subjected to epitaxial growth under the conditions of Table 9 in an ordinary thermal CVD apparatus to bring the thickness of the monocrystalline silicon layer to 30 μm.

TABLE 9

| gas flow ratio | substrate temperature | pressure | growth time |
|---|---|---|---|
| SiH$_2$Cl$_2$/H$_2$ = 0.5/100 (1/min.) | 1050° C. | atmosphere | 30 min. |

In the course of growth, B$_2$H$_6$ in an amount of several hundred ppm was added to grow the silicon layer of p+ layer, and then the amount of B$_2$H$_6$ was reduced to a fraction of ppm to about several ppm to obtain a p− layer, and, at the end phase of the growth, PH$_3$ in an amount of several hundred ppm was introduced instead of B$_2$H$_6$ to form an n+ layer of 0.2 μm, thereby forming a junction ((c) in FIG. 14).

After the growth, a solar cell structure was prepared by forming an ITO transparent conductive film (82 nm)/current collecting electrode (Ti/Pd/Ag (400 nm/200 nm/1 μm)) on the n+ layer by EB evaporation, ((d) FIG. 14). Then, on a Tefzel® film of a thickness of 80 μm, copper paste was applied by screen printing with a thickness of 10 to 30 μm, and the coated surface thereof was maintained in close contact with and adhered to the transparent conductive film/current collecting electrode surface of the above-mentioned wafer ((e) in FIG. 14).

After the adhesive material was sufficiently set, the exposed face of the wafer fixed to the Tefzel® film was fixed by a vacuum chuck (not shown), and an end of the Tefzel® film was pulled to gradually peel the film from the wafer, utilizing the flexibility of the Tefzel® film. In this manner the silicon layer was peeled from the wafer and transferred onto the Tefzel® film ((f) in FIG. 14).

The porous layer remaining on the silicon layer peeled off from the silicon wafer was selectively etched with a mixture of hydrofluoric acid, hydrogen peroxide and deionized water, under agitation. The silicon layer remained without being etched, while the porous layer alone was completely removed.

A rear electrode was formed by sputtering Al with a thickness of 0.1 μm, on the rear side of the silicon layer on the Tefzel® film ((g) in FIG. 14).

Thus obtained thin film monocrystalline silicon solar cell on Tefzel® film was subjected to the measurement of the I–V characteristics under the irradiation with light of AM1.5 (100 mW/cm$^2$). With a cell area of 6 cm$^2$, there were obtained an open-circuit voltage of 0.59 V, a shortcircuit photocurrent of 34 mA/cm$^2$ and a fill factor of 0.79, with an energy conversion efficiency of 15.8%.

The porous layer remaining on the silicon wafer after peeling was also removed by etching in the above-explained manner, whereby a smooth surface was exposed ((h) in FIG. 14). The regenerated wafer thus obtained was subjected to the above-explained process repeatedly to obtain plural units of the thin film monocrystalline solar cell having a semiconductor layer of high quality.

EXAMPLE 28

This example shows the preparation of a solar cell by transferring a monocrystalline silicon layer onto a resinous film by the process shown in FIG. 15, and again transferring the silicon layer onto a second substrate.

Figure 15:
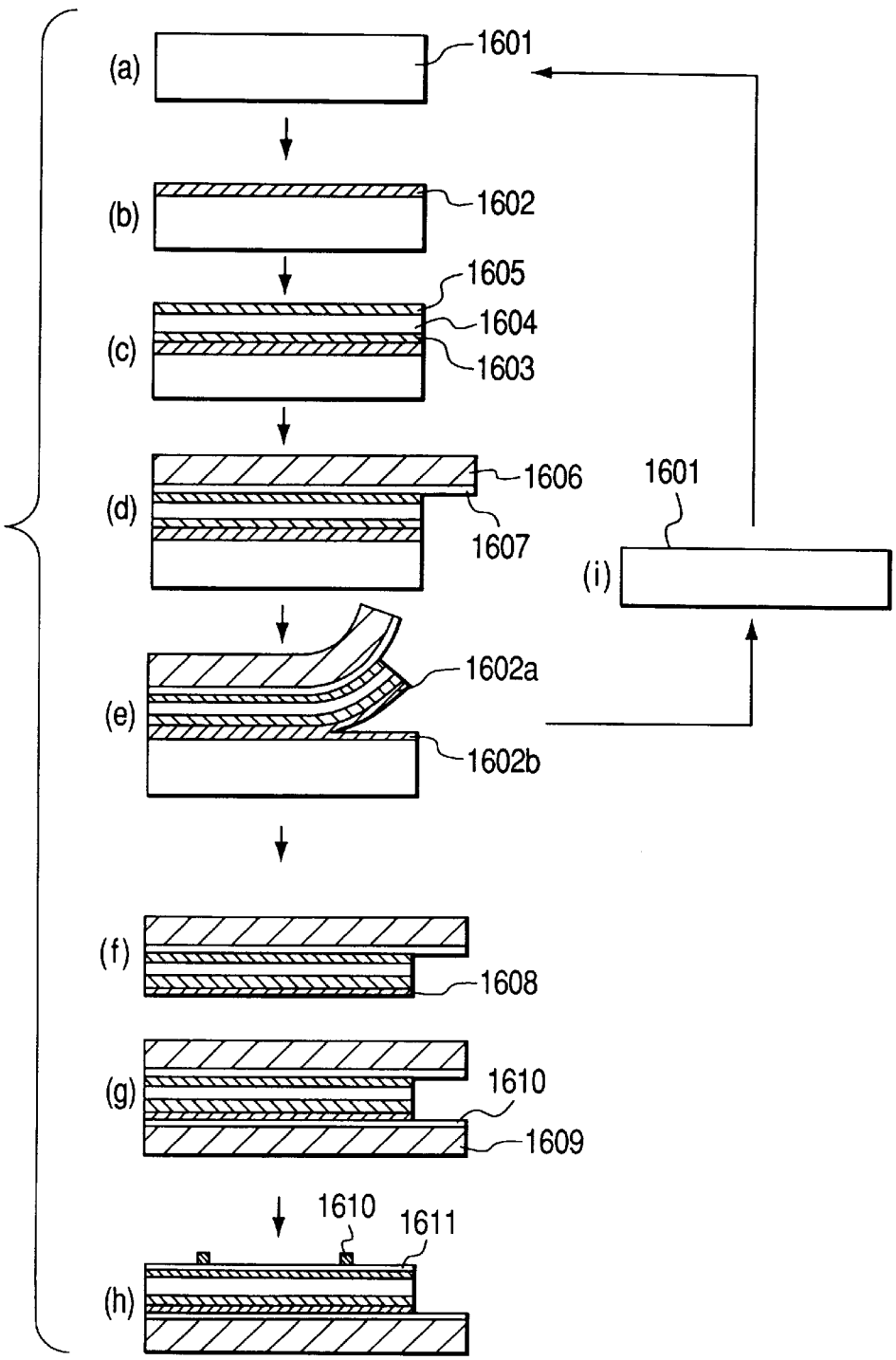
FIG. 15 is a drawing for explaining another process for producing a solar cell according to the process of the present invention.
Figure 16A:
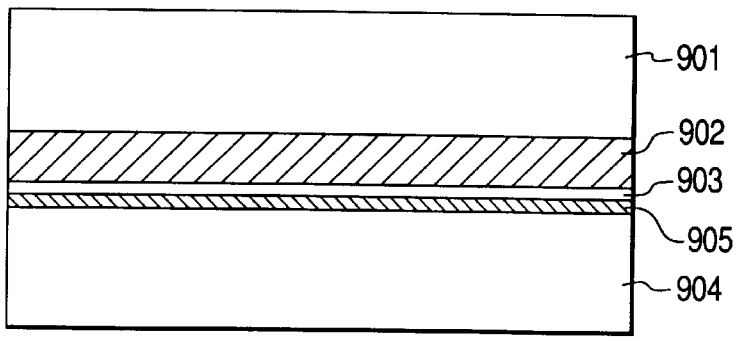
FIGS. 16A, 16B, and 16C are drawings for explaining a prior art process.
Figure 16B:
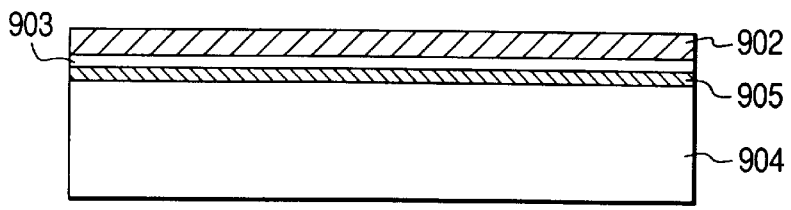
Figure 16C:
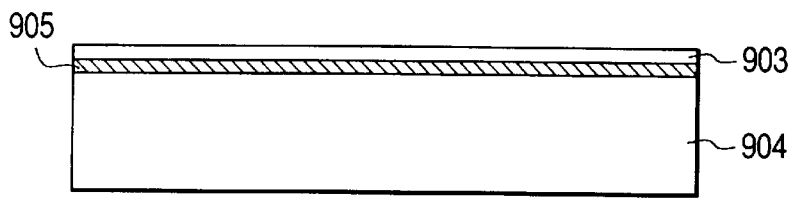
Figure 17A:
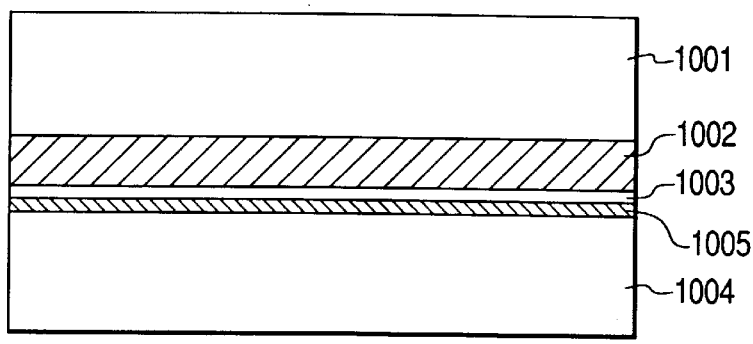
FIGS. 17A, 17B, and 17C are drawings for explaining another prior art process.
Figure 17B:
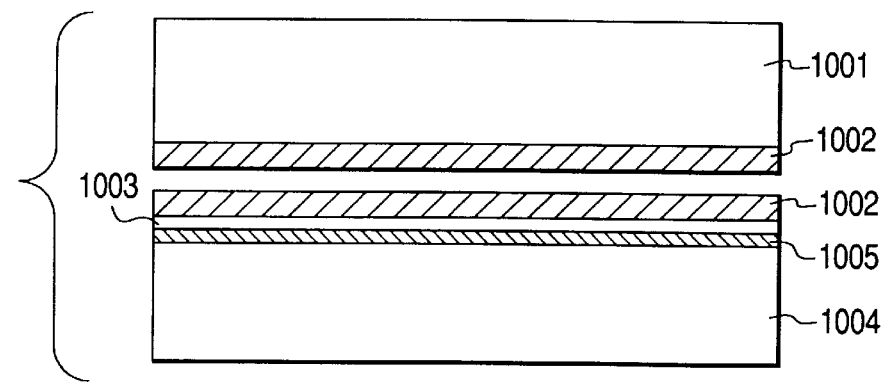
Figure 17C:
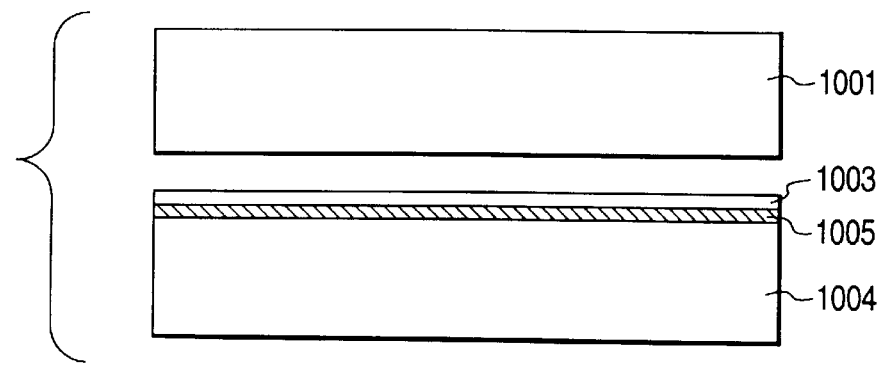

On the surface of a monocrystalline silicon wafer 500 μm thick, boron was thermally diffused at 1200° C. utilizing BCl$_3$ as the thermal diffusion source, to form a p$^+$ diffusion layer of about 3 μm ((a) in FIG. 15). Then anodizing was conducted in HF solution under the conditions shown in Table 10 to form a porous silicon layer on the wafer ((b) in FIG. 15). The anodizing was initiated with a low current density of 5 mA/cm$^2$ for 2.5 minutes, then the current was gradually increased and the anodizing was terminated when the current density reached 30 mA/cm$^2$ after 30 seconds.

TABLE 10

| anodizing bath | HF:H$_2$O:C$_2$H$_5$OH = 1:1:1 |
|---|---|
| current density | 5 → 30 mA/cm$^2$ |
| anodizing time | 2.5 min. → (30 sec.) → 0 sec. |

The surface of the porous silicon layer was then subjected to epitaxial growth under the conditions of Table 11 in an ordinary thermal CVD apparatus to bring the thickness of the monocrystalline silicon layer to 40 μm.

TABLE 11

| gas flow ratio | substrate temperature | pressure | growth time |
|---|---|---|---|
| SiH$_2$Cl$_2$/H$_2$ = 0.5/100 (1/min.) | 1050° C. | atmosphere | 40 min. |

In the course of growth, B$_2$H$_6$ in an amount of several hundred ppm was added to grow the silicon layer of p$^+$ layer 1 μm thick, and then the amount of B$_2$H$_6$ was reduced to a fraction of ppm to about several ppm to obtain a p$^-$ layer, and, at the end phase of the growth, PH$_3$ in an amount of several hundred ppm was introduced instead of B$_2$H$_6$ to form an n$^+$ layer of 0.2 μm, thereby forming a junction ((c) in FIG. 15).

Then the adhesive face of a UV curable adhesive tape 90 μm thick was adhered to the n$^+$ layer of the above-mentioned wafer ((d) in FIG. 15).

The exposed face of the wafer fixed to the adhesive film was fixed by a vacuum chuck (not shown), and an end of the adhesive film was pulled to gradually peel the film from the wafer, utilizing the flexibility of the adhesive film. In this manner the silicon layer was peeled from the wafer and transferred onto the adhesive film ((e) in FIG. 15).

The porous layer remaining on the silicon layer peeled off from the silicon wafer was selectively etched with a mixture of hydrofluoric acid, hydrogen peroxide and deionized water, under agitation. The silicon layer remained without being etched, while the porous layer alone was completely removed.

A rear electrode was formed by sputtering Ag with a thickness of 0.1 μm, on the rear side of the silicon layer on the adhesive film ((f) in FIG. 15). A stainless steel backing plate bearing thereon tin/lead solder was maintained in contact with the rear electrode of the above-mentioned silicon layer, and heat was applied in this state to fuse the solder, thereby fixing the backing plate with the silicon layer ((g) in FIG. 15).

Finally the adhesive film on the surface of the silicon layer was peeled after ultraviolet irradiation to reduce the adhesive power, and an ITO transparent conductive film (82 nm)/current collecting electrode (Ti/Pd/Ag (400 nm/200 nm/1 μm)) was formed by EB (electron beam) evaporation on the n$^+$ layer ((h) in FIG. 15).

The thin film monocrystalline silicon solar cell obtained by double transfer was subjected to the measurement of the I–V characteristics under the irradiation with light of AM1.5 (100 mW/cm$^2$). With a cell area of 6 cm$^2$, there were obtained an open-circuit voltage of 0.6 V, a shortcircuit photocurrent of 34 mA/cm$^2$ and a fill factor of 0.78, with an energy conversion efficiency of 15.9%.

The porous layer remaining on the silicon wafer after peeling was also removed by etching in the above-explained manner, whereby a smooth surface was exposed ((i) in FIG. 15). The regenerated wafer thus obtained was subjected to the above-explained process repeatedly to obtain plural units of the thin film monocrystalline solar cell having a semiconductor layer of high quality.

EXAMPLE 29

This example shows the preparation of a solar cell by transferring a silicon layer formed on a metallurgical grade silicon substrate by the process shown in FIG. 11 onto a polyimide film.

The metallurgical grade silicon means silicon with an impurity concentration of about 1 ppm to 2%.

An ingot was prepared by CZ (Czochralski) method from metallurgical grade silicon of a purity of 98%, then sliced into wafers of a thickness of 0.5 mm and mirror polished to obtain metallurgical grade silicon substrates. Table 12 shows the result of elementary analysis in the surface area of thus prepared metallurgical grade silicon substrate.

TABLE 12

| Impurity | Metallurgical grade Si substrate |
| --- | --- |
| B | 8 ppm |
| Al | 2 ppm |
| Ni | <5 ppm |
| Fe | 1 ppm |
| Cr | 0.6 ppm |
| Mn | <0.2 ppm |
| Ti | <1 ppm |

The metallurgical grade silicon substrate had a crystal grain size of several millimeters to several centimeters, and a specific resistivity of 0.05 Ωcm (p type) ((a) in FIG. 11).

Then anodizing was conducted in HF solution under the conditions shown in Table 13 to form a porous silicon layer on the metallurgical grade silicon ((b) in FIG. 11). The anodizing was initiated with a low current density of 2 mA/cm$^2$ for 2 minutes, then the current was gradually increased to 25 mA/cm$^2$ and the anodizing was terminated after this current level was maintained for 6 seconds.

TABLE 13

| | |
| --- | --- |
| anodizing bath | HF:H$_2$O:C$_2$H$_5$OH = 1:1:1 |
| current density | 2 → 25 mA/cm$^2$ |
| anodizing time | 2 min. → (1 min.) → 6 sec. |

The surface of the porous silicon layer was then subjected to crystal growth under the conditions of Table 14 in an ordinary thermal CVD apparatus to bring the thickness of the polycrystalline silicon layer to 30 μm.

In the course of growth, a small amount of B$_2$H$_6$ (a fraction to several ppm) was added to grow the silicon layer of p$^-$ layer, and, at the end phase of the growth, the amount of B$_2$H$_6$ was increased to several hundred ppm to obtain a p$^+$ layer ((c) and (d) in FIG. 11).

TABLE 14

| gas flow ratio | substrate temperature | pressure | growth time |
| --- | --- | --- | --- |
| SiH$_4$/H$_2$ = 0.5/100 (1/min.) | 1050° C. | 100 Torr | 25 min. |

On a polyimide film 50 μm thick, copper paste was applied by screen printing with a thickness of 10 to 30 μm, and the surface thereof was maintained in close contact with and adhered to the p$^+$ silicon layer of the above-mentioned wafer.

In this state heat treatment was conducted for 20 minutes at 360° C. in an oven to sinter the copper paste and to fix the polyimide film and the wafer ((e) in FIG. 11).

The exposed face of the wafer fixed to the polyimide film was fixed by a vacuum chuck (not shown), and an end of the polyimide film was pulled to gradually peel the film from the wafer, utilizing the flexibility of the polyimide film. In this manner the silicon layer was peeled from the metallurgical grade silicon wafer and transferred onto the polyimide film ((f) in FIG. 11).

The porous layer remaining on the silicon layer peeled off from the metallurgical grade silicon wafer was selectively etched with a mixture of hydrofluoric acid, hydrogen peroxide and deionized water, under agitation. The silicon layer remained without being etched, while the porous layer alone was completely removed.

It was confirmed, in the cross-sectional observation under a transmission electron microscope, that the Si layer did not show an introduction of new crystalline defects and maintained satisfactory crystallinity.

The surface of the silicon layer obtained on the polyimide film was cleaned by etching with hydrofluoric acid/nitric acid mixture, and, on the silicon layer, an n-type μc-Si layer was deposited with a thickness of 200 Å under the conditions shown in foregoing Table 3, in an ordinary plasma CVD apparatus ((g) in FIG. 11).

Finally, on the μc-Si layer, there were formed ITO transparent conductive film (82 nm)/current collecting electrode (Ti/Pd/Ag (400 nm/200 nm/1 μm)) by EB (electron beam) evaporation to obtain a solar cell ((h) in FIG. 11).

Thus obtained thin film polycrystalline silicon solar cell on polyimide film was subjected to the measurement of the I–V characteristics under the irradiation with light of AM1.5 (100 mW/cm$^2$). With a cell area of 6 cm$^2$, there were obtained an open-circuit voltage of 0.57 V, a shortcircuit photocurrent of 32 mA/cm$^2$ and a fill factor of 0.77, with an energy conversion efficiency of 14%.

The porous layer remaining on the silicon wafer after peeling was also removed by etching in the above-explained manner, whereby a smooth surface was exposed ((i) in FIG. 11). The regenerated wafer thus obtained was subjected to the above-explained process repeatedly to obtain plural units of the thin film polycrystalline solar cell having a semiconductor layer of high quality.

EXAMPLE 30

The surface layer of a first monocrystalline Si substrate was anodized in HF solution, under the following conditions:

current density: 7 (mA/cm$^2$)
anodizing bath: HF:H$_2$O:C$_2$H$_5$OH=1:1:1
time: 4 minutes
porous Si thickness: 4.5 μm followed by:
current density: 30 (mA/cm$^2$)
anodizing bath: HF:H$_2$O:C$_2$H$_5$OH=1:1:1
time: 1 minute
porous Si thickness: about 4 μm In this anodizing with the current density of 30 mA/cm$^2$, there was formed a structurally fragile porous Si layer with larger porosity.

Then the substrate was oxidized for 1 hour at 400° C. in oxygen atmosphere, whereby the internal wall of the pores in the porous Si layer was covered with a thermal oxidation film.

This thermal treatment is to form a thin oxide film on the lateral wall of the pores in advance at a lower temperature (while maintaining monocrystallinity in the porous layer), thereby avoiding rearrangement of the pores and stabilizing the structure of the porous layer.

Then, the outermost surface of the porous layer on the substrate was immersed in 1.25% HF solution whereby the thin oxide film on the outermost surface was removed. The substrate thus obtained was subjected to a heat treatment for 1 minute under the conditions of 1050° C. and 760 Torr and in a H$_2$ flow of 2301/min., followed by a heat treatment for 5 minutes in an SiH$_4$ flow of 50 sccm.

This treatment is to form a silicon film very gradually by supplying a trace amount of a silicon-containing raw material gas into the film forming chamber, thereby sealing the outermost surface of the pores of the porous silicon layer.

Then, on the porous Si, monocrystalline Si was epitaxially grown, with a thickness of 0.3 μm, by CVD (chemical vapor deposition) under the following conditions:

source gas: $SiH_2Cl_2/H_2$
gas flow rate: 0.5/180 l/min.
gas pressure: 80 Torr
temperature: 950° C.
growth rate: 0.3 μm/min.

Subsequently a $SiO_2$ layer 200 nm thick was formed by thermal oxidation on the surface of the epitaxial Si layer.

Then an adhesive film was applied to the $SiO_2$ surface and was then peeled off from the wafer in the same manner as in Example 8.

As a result, the wafer was split on the lower fragile porous Si layer of higher porosity as the boundary, and the $SiO_2$ layer, the epitaxial layer and the porous Si layer were left on the adhesive film.

The subsequent steps were conducted in the same manner as in Example 8.

In this manner a monocrystalline Si layer of a thickness of 0.2 μm was formed on the Si oxide film. The thickness of thus formed monocrystalline Si layer, measured in 100 points on the entire wafer, was uniform within a range of 201±6 nm.

Then thermal treatment was conducted for 1 hour at 1100° C. in hydrogen atmosphere. The surface roughness, evaluated by an atomic force microscope, was about 0.2 nm represented by the mean square roughness in a square area of 5 μm, which was comparable to that of the commercially available wafer.

It was confirmed, in the cross-sectional observation under a transmission electron microscope, that the Si layer did not show an introduction of new crystalline defects and maintained satisfactory crystallinity.

What is claimed is:

1. A process for producing a semiconductor article comprising the steps of:
    bonding a flexible film onto a porous semiconductor layer on a surface of a substrate; and
    applying a force to the flexible film in a peeling direction so as to separate the porous semiconductor layer from the substrate;
    whereby the porous semiconductor layer is transferred onto the flexible film.

2. The process for producing a semiconductor article according to claim 1, wherein the film is comprised of a resin film.

3. The process for producing a semiconductor article according to claim 1, wherein the film is comprised of an electroconductive film.

4. The process for producing a semiconductor article according to claim 1, wherein the film is adherent.

5. The process for producing a semiconductor article according to claim 1, wherein the film is bonded with interposition of an adhesive to the substrate.

6. The process for producing a semiconductor article according to claim 1, wherein the film has a thickness ranging from 5 μm to 3 cm.

7. The process for producing a semiconductor article according to claim 6, wherein the film has a thickness ranging from 10 μm to 1 cm.

8. The process for producing a semiconductor article according to claim 1, wherein the substrate is prepared by making partially porous a single crystal silicon substrate.

9. The process for producing a semiconductor article according to claim 8, wherein the substrate is made porous by anodization.

10. The process for producing a semiconductor article according to claim 1, wherein another porous semiconductor layer is formed on the substrate after removal of the porous layer remaining on the side of the substrate after the separation of the film, and another film is bonded again to the substrate.

11. A process for producing a semiconductor article comprising the steps of:
    bonding a flexible film onto a nonporous semiconductor layer on a porous semiconductor layer of a first substrate; and
    applying a force to the flexible film in a peeling direction so as to separate the nonporous semiconductor layer from the first substrate at the porous semiconductor layer;
    whereby the nonporous semiconductor layer is transferred onto the flexible film.

12. The process for producing a semiconductor article according to claim 11, wherein the film is comprised of a resin film.

13. The process for producing a semiconductor article according to claim 11, wherein the film is comprised of an electroconductive film.

14. The process for producing a semiconductor article according to claim 11, wherein the film is adherent.

15. The process for producing a semiconductor article according to claim 11, wherein the film is bonded with interposition of an adhesive to the substrate.

16. The process for producing a semiconductor article according to claim 11, wherein the film has a thickness ranging from 5 μm to 3 cm.

17. The process for producing a semiconductor article according to claim 16, wherein the film has a thickness ranging from 10 μm to 1 cm.

18. The process for producing a semiconductor article according to claim 11, wherein the first substrate is formed from a silicon substrate.

19. The process for producing a semiconductor article according to claim 18, wherein the silicon substrate is a single crystal silicon substrate.

20. The process for producing a semiconductor article according to claim 19, wherein the first substrate is prepared by making partially porous the single crystal silicon substrate to form the porous semiconductor layer, and forming the nonporous semiconductor layer on the porous semiconductor layer.

21. The process for producing a semiconductor article according to claim 20, wherein the nonporous semiconductor layer is formed from silicon.

22. The process for producing a semiconductor article according to claim 20, wherein the nonporous semiconductor layer is formed from a compound semiconductor.

23. The process for producing a semiconductor article according to claim 20, wherein the nonporous semiconductor layer is formed by epitaxial growth.

24. The process for producing a semiconductor article according to claim 19, wherein the first substrate is formed by implanting ions into the interior of the single crystal silicon substrate to form the porous layer in the interior with the ion implantation surface kept nonporous.

25. The process for producing a semiconductor article according to claim 24, wherein the ions are selected from the group of ions of rare gases, hydrogen, and nitrogen.

26. The process for producing a semiconductor article according to claim 24, wherein an insulation layer is formed on the single crystal silicon substrate, and the ions are implanted from the side of the insulation layer.

27. The process for producing a semiconductor article according to claim 11, wherein the porous layer is formed by anodization.

28. The process for producing a semiconductor article according to claim 27, wherein the porous layer is formed in a multiple layer structure by changing the electric current density during the anodization to change the porosity of the porous layer.

29. A process for producing a semiconductor article according to claim 11, which is applied to production of a solar cell.

30. The process for producing a semiconductor article according to claim 29, comprising steps of preparing the first substrate by forming the porous semiconductor layer by making the silicon substrate porous partially, and forming the nonporous semiconductor layer on the porous semiconductor layer; bonding the film onto the nonporous semiconductor layer; and separating the nonporous semiconductor layer by applying a force in a direction of peeling the film from the first substrate.

31. The process for producing a semiconductor article according to claim 30, wherein the substrate obtained by removal of the porous semiconductor layer remaining on the first substrate after the separation step is reused as the material of the first substrate.

32. The process for producing a semiconductor article according to claim 30, wherein a semiconductor junction is formed, after the separation of the layers, on the nonporous semiconductor layer bared by removal of the porous semiconductor layer remaining on the film side.

33. The process for producing a semiconductor article according to claim 30, wherein a semiconductor junction is formed in the step of forming the nonporous semiconductor layer on the porous semiconductor layer.

34. The process for producing a semiconductor article according to claim 30, wherein both the front face and the reverse face of the silicon substrate are made porous, and the subsequent steps are conducted on both of the faces.

35. The process for producing a semiconductor article according to claim 30, wherein the silicon substrate is comprised of single crystal silicon.

36. The process for producing a semiconductor article according to claim 30, wherein the silicon substrate is comprised of polycrystal silicon.

37. The process for producing a semiconductor article according to claim 30, wherein the silicon substrate is comprised of metallurgical grade silicon.

38. The process for producing a semiconductor article according to claim 30, wherein silicon is used as the nonporous semiconductor layer.

39. The process for producing a semiconductor article according to claim 30, wherein a compound semiconductor is used as the nonporous semiconductor layer.

40. The process for producing a semiconductor article according to claim 30, wherein a heat-resistant film is used as the film.

41. The process for producing a semiconductor article according to claim 40, wherein the film is heat-resistant at a temperature of not higher than 400° C.

42. The process for producing a semiconductor article according to claim 30, wherein the heat-resistant film is a high polymer film.

43. The process for producing a semiconductor article according to claim 30, wherein the nonporous semiconductor and the film is bonded with interposition of an electroconductive paste.

44. The process for producing a semiconductor article according to claim 43, wherein the electroconductive paste is fired.

45. A process for producing a semiconductor article comprising the steps of:

bonding a flexible film onto a nonporous semiconductor layer on a porous semiconductor layer of a first substrate;

applying a force to the flexible film in a peeling direction, so that the nonporous semiconductor layer is separated from the first substrate at the porous semiconductor layer; and bonding the separated nonporous semiconductor layer on to a second substrate;

whereby the nonporous semiconductor layer is transferred onto the second substrate.

46. The process for producing a semiconductor article according to claim 45, wherein the film is comprised of a resin film.

47. The process for producing a semiconductor article according to claim 45, wherein the film is comprised of an electroconductive film.

48. The process for producing a semiconductor article according to claim 45, wherein the film is adherent.

49. The process for producing a semiconductor article according to claim 45, wherein the film is bonded with interposition of an adhesive to the substrate.

50. The process for producing a semiconductor article according to claim 45, wherein the film has a thickness ranging from 5 $\mu$m to 3 cm.

51. The process for producing a semiconductor article according to claim 50, wherein the film has a thickness ranging from 10 $\mu$m to 1 cm.

52. The process for producing a semiconductor article according to claim 45, wherein the first substrate is formed from a silicon substrate.

53. The process for producing a semiconductor article according to claim 52, wherein the silicon substrate is a single crystal silicon substrate.

54. The process for producing a semiconductor article according to claim 53, wherein the first substrate is prepared by making partially porous the single crystal silicon substrate to form the porous semiconductor layer, and forming the nonporous semiconductor layer on the porous semiconductor layer.

55. The process for producing a semiconductor article according to claim 54, wherein the nonporous semiconductor layer is formed from silicon.

56. The process for producing a semiconductor article according to claim 54, wherein the nonporous semiconductor layer is formed from a compound semiconductor.

57. The process for producing a semiconductor article according to claim 54, wherein the nonporous semiconductor layer is formed by epitaxial growth.

58. The process for producing a semiconductor article according to claim 54, wherein an insulation layer is formed on the surface of the nonporous semiconductor layer, and the film is bonded to the surface of the insulation layer.

59. The process for producing a semiconductor article according to claim 53, wherein the first substrate is formed by implanting ions into the interior of the single crystal silicon substrate to form the porous layer in the interior with the ion implantation surface kept nonporous.

60. The process for producing a semiconductor article according to claim 59, wherein the ions are selected from the group of ions of rare gases, hydrogen, and nitrogen.

61. The process for producing a semiconductor article according to claim 59, wherein an insulation layer is formed on the single crystal silicon substrate, and the ions are implanted from the side of the insulation layer.

62. The process for producing a semiconductor article according to claim 61, wherein the film is bonded to the insulation layer.

63. The process for producing a semiconductor article according to claim 45, wherein a silicon substrate is used as the second substrate.

64. The process for producing a semiconductor article according to claim 63, wherein a silicon substrate having an insulation layer formed thereon is used as the second substrate.

65. The process for producing a semiconductor article according to claim 45, wherein a light-transmissive substrate is used as the second substrate.

66. The process for producing a semiconductor article according to claim 45, wherein the nonporous semiconductor layer on the separated film is bonded to a supporting member, and further bonded to the second substrate with the supporting member kept bonded.

67. The process for producing a semiconductor article according to claim 66, wherein the nonporous layer which is held on the separated film and bared by removal of the remaining porous layer from the surface of the nonporous layer is bonded to the supporting member.

68. The process for producing a semiconductor article according to claim 66, wherein the porous layer remaining on the surface of the nonporous layer on the separated film is bonded to the supporting member.

69. The process for producing a semiconductor article according to claim 66, wherein the supporting member is removed after the bonding of the nonporous semiconductor layer onto the second substrate.

70. The process for producing a semiconductor article according to claim 45, wherein the film is removed after the nonporous layer is bonded to the second substrate.

71. The process for producing a semiconductor article according to claim 54, wherein the porous layer is formed by anodization.

72. The process for producing a semiconductor article according to claim 71, wherein the porous layer is formed in a multiple layer structure by changing the electric current density during the anodization to change the porosity of the porous layer.

73. The process for producing a semiconductor article according to claim 54, wherein both the front face and the reverse face of the silicon substrate are made porous, and the subsequent steps are conducted on both of the faces.

74. The process for producing a semiconductor article according to claim 45, wherein the substrate obtained by removal of the porous semiconductor layer remaining on the first substrate after the separation step is reused as the material for the first substrate.

75. The process for producing a semiconductor article according to claim 45, wherein the substrate obtained by removal of the porous semiconductor layer remaining on the first substrate after the separation step is reused as the material for the second substrate.

76. A process for producing a semiconductor article comprising the steps of:

implanting ions of rare gas, hydrogen or nitrogen into a semiconductor substrate so as to form an implanted layer beneath a nonporous surface of the semiconductor substrate so that the nonporous surface of the semiconductor substrate becomes a nonporous semiconductor layer;

bonding a flexible film onto the nonporous surface of the semiconductor substrate; and applying a force to the flexible film in a peeling direction so as to separate the nonporous semiconductor layer from the substrate at the implanted layer;

whereby the nonporous semiconductor layer is transferred onto the flexible film.

77. A process according to claim 11 or 45, wherein said process further comprises the step of forming an insulating layer on the surface of the nonporous semiconductor layer, and wherein the flexible film is bonded onto the nonporous semiconductor layer with an insulating layer therebetween.

78. A process according to claim 76, wherein said process further comprises the step of forming an insulating layer on the surface of the semiconductor substrate, and wherein the flexible film is bonded onto the nonporous surface of the insulating layer.

* * * * *